(12) United States Patent
Li et al.

(10) Patent No.: US 11,930,674 B2
(45) Date of Patent: Mar. 12, 2024

(54) DISPLAY SUBSTRATE AND PREPARATION METHOD THEREOF, AND DISPLAY APPARATUS

(71) Applicant: BOE Technology Group Co., Ltd., Beijing (CN)

(72) Inventors: Yunlong Li, Beijing (CN); Pengcheng Lu, Beijing (CN); Shuai Tian, Beijing (CN); Yu Ao, Beijing (CN); Zhijian Zhu, Beijing (CN); Yuanlan Tian, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 479 days.

(21) Appl. No.: 17/261,034

(22) PCT Filed: Mar. 27, 2020

(86) PCT No.: PCT/CN2020/081852
§ 371 (c)(1),
(2) Date: Jan. 18, 2021

(87) PCT Pub. No.: WO2021/189480
PCT Pub. Date: Sep. 30, 2021

(65) Prior Publication Data
US 2023/0269974 A1   Aug. 24, 2023

(51) Int. Cl.
*H10K 59/131*   (2023.01)
*H10K 59/12*   (2023.01)
(Continued)

(52) U.S. Cl.
CPC ....... *H10K 59/131* (2023.02); *H10K 59/1201* (2023.02); *H10K 59/124* (2023.02); *H10K 71/162* (2023.02)

(58) Field of Classification Search
CPC ............. H10K 59/131; H10K 59/1201; H10K 59/124; H10K 71/162; H01L 29/78651; H01L 29/66742
See application file for complete search history.

(56) References Cited

U.S. PATENT DOCUMENTS

| 9,337,124 | B1 | 5/2016 | Herrault et al. | |
| 11,616,107 | B2 * | 3/2023 | Xie | H10K 59/00 257/40 |

(Continued)

FOREIGN PATENT DOCUMENTS

| CN | 104049393 A | 9/2014 |
| CN | 107275342 A | 10/2017 |

(Continued)

OTHER PUBLICATIONS

European Search Report for EP20904242.3 dated May 2, 2023.
Office Action dated Jan. 9, 2024 for Japanese Patent Application No. 2021-570219 and English Translation.

*Primary Examiner* — David Vu
(74) *Attorney, Agent, or Firm* — Ling Wu; Stephen Yang; Ling and Yang Intellectual Property

(57) ABSTRACT

Provided is a display substrate, including: a silicon-based substrate having a display area, a binding area located on one side of the display area, and a trace area located between the display area and the binding area; a trace protection structure is arranged on the silicon-based substrate in the trace area, and a pad assembly is integrated in the silicon-based substrate in the binding area; and a minimum distance between an edge of an orthographic projection of the trace protection structure on the silicon-based substrate and an edge of an orthographic projection of an opening of the pad assembly on the silicon-based substrate is smaller than a maximum size of one subpixel.

19 Claims, 9 Drawing Sheets

(51) Int. Cl.
*H10K 59/124* (2023.01)
*H10K 71/16* (2023.01)

(56) References Cited

U.S. PATENT DOCUMENTS

| | | |
|---|---|---|
| 2004/0137142 A1 | 7/2004 | Nishikawa |
| 2009/0237581 A1 | 9/2009 | Kim et al. |
| 2014/0218653 A1 | 8/2014 | Funahashi |
| 2015/0362769 A1 | 12/2015 | Huang |
| 2018/0040681 A1 | 2/2018 | Sakairi et al. |
| 2018/0102083 A1 | 4/2018 | So et al. |
| 2018/0122882 A1 | 5/2018 | Lee et al. |
| 2019/0295973 A1 | 9/2019 | Xiao et al. |

FOREIGN PATENT DOCUMENTS

| | | |
|---|---|---|
| CN | 107919067 A | 4/2018 |
| CN | 207269024 U | 4/2018 |
| CN | 208284480 U | 12/2018 |
| JP | 2004165068 A | 6/2004 |
| JP | 2010217245 A | 9/2010 |
| JP | 2010230885 A | 10/2010 |
| JP | 2014149482 A | 8/2014 |
| JP | 2016157566 A | 9/2016 |
| JP | 2018125168 A | 8/2018 |
| KR | 20030057752 A | 7/2003 |
| KR | 20080061547 A | 7/2008 |

\* cited by examiner

US 11,930,674 B2

DISPLAY SUBSTRATE AND PREPARATION METHOD THEREOF, AND DISPLAY APPARATUS

CROSS-REFERENCE TO RELATED APPLICATION

The present application is a U.S. National Phase Entry of International Application No. PCT/CN2020/081852 having an international filing date of Mar. 27, 2020. The above-identified application is incorporated into this application by reference in their entirety.

TECHNICAL FIELD

The present disclosure relates to, but is not limited to, the field of display technology, in particular to a display substrate and a preparation method thereof, and a display apparatus.

BACKGROUND

Micro Organic Light-emitting Diodes (Micro-OLEDs) are micro-displays that have been developed in recent years, and silicon-based OLEDs are one kind of them. A silicon-based OLED can not only enable active addressing of pixels, but also enable the preparation of various functional circuits, including a timing control (TCON) circuit, an Over Current Protection (OCP) circuit, or the like, on a silicon-based substrate. This is conducive to reducing the system volume and realizing light weight. A silicon-based OLED is prepared by the mature Complementary Metal Oxide Semiconductor (CMOS) integrated circuit technology, has the advantages of small volume, high resolution (PPI), high refresh rate, etc., and is widely used in the near-eye display field of Virtual Reality (VR) or Augmented Reality (AR).

SUMMARY

The following is a summary of subject matter described in detail herein. This summary is not intended to limit the protection scope of the claims.

The present disclosure provides a display substrate and a preparation method thereof, and a display apparatus.

In one aspect, the present disclosure provides a display substrate, including: a silicon-based substrate having a display area, a binding area located on one side of the display area, and a trace area located between the display area and the binding area; a trace protection structure is arranged on the silicon-based substrate in the trace area, and a pad assembly is integrated in the silicon-based substrate in the binding area; and a minimum distance between an edge of an orthographic projection of the trace protection structure on the silicon-based substrate and an edge of an orthographic projection of an opening of the pad assembly on the silicon-based substrate is smaller than a maximum size of one subpixel.

In another aspect, the present disclosure provides a display apparatus, including the display substrate described above.

In a further aspect, the present disclosure provides a method for preparing a display substrate, including: forming an array structure layer and a light emitting structure layer sequentially on a silicon-based substrate in a display area, and forming a trace protection structure on a silicon-based substrate in a trace area between the display area and a binding area; wherein the binding area is located on one side of the display area, a pad assembly is integrated in the silicon-based substrate in the binding area, and a minimum distance between an edge of an orthographic projection of the trace protection structure on the silicon-based substrate and an edge of an orthographic projection of an opening of the pad assembly on the silicon-based substrate is smaller than a maximum size of one subpixel.

Other aspects will become apparent upon reading and understanding accompanying drawings and the detailed description.

BRIEF DESCRIPTION OF DRAWINGS

Accompanying drawings are used to provide an understanding of technical solutions of the present disclosure and form a part of the specification. Together with embodiments of the present disclosure, they are used to explain technical solutions of the present disclosure and do not constitute a limitation on the technical solutions of the present disclosure.

DETAILED DESCRIPTION

Figure 1:
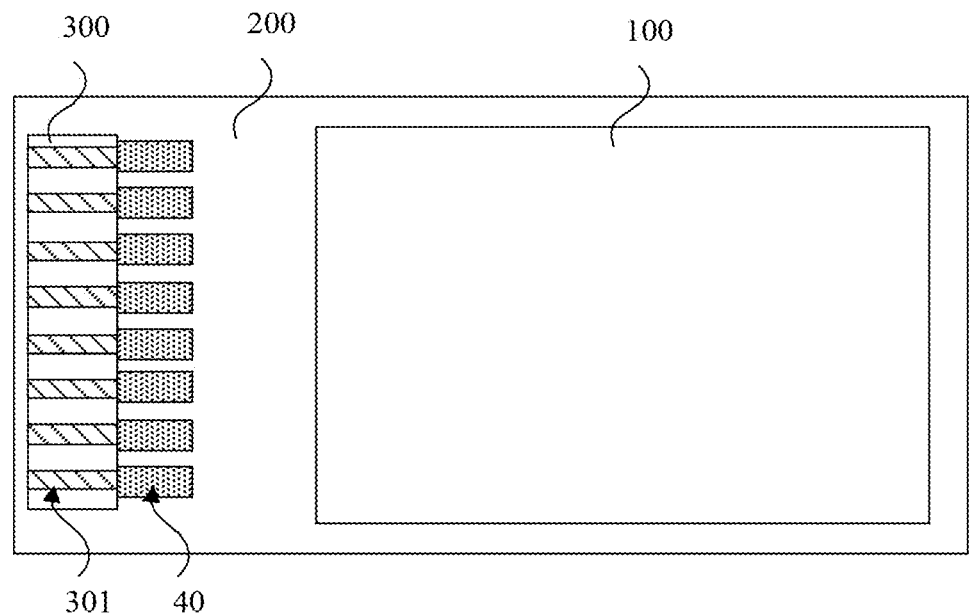
FIG. 1 is a schematic plan view of a display substrate according to at least one embodiment of the present disclosure.

A plurality of embodiments are described in the present disclosure, but the description is exemplary rather than limiting, and what is obvious for those of ordinary skills in the art is that there may be more embodiments and implementation solutions within the scope of the embodiments described in the present disclosure. Although many possible combinations of features are shown in the drawings and discussed in the Detailed Description, many other combinations of the disclosed features are also possible. Unless specifically limited, any feature or element of any embodiment may be used in combination with or in place of any other feature or element of any other embodiment.

The present disclosure includes and contemplates combinations with features and elements known to those of ordinary skills in the art. Embodiments, features and elements already disclosed in the present disclosure may also be combined with any conventional features or elements to form a unique solution defined by the claims. Any feature or element of any embodiment may also be combined with features or elements from other solutions to form another unique solution defined by the claims. Therefore, it should be understood that any of the features shown and discussed in the present disclosure may be implemented individually or in any suitable combination. Therefore, the embodiments are not otherwise limited except in accordance with the appended claims and equivalents thereof. In addition, one or more modifications and changes can be made within the protection scope of the appended claims.

Furthermore, in describing representative embodiments, the specification may have presented a method or process as a specific sequence of steps. However, to the extent that the method or process does not depend on the specific order of steps described herein, the method or process should not be limited to the specific order of steps described. As those of ordinary skills in the art will understand, other sequences of steps are also possible. Therefore, the specific order of steps set forth in the specification should not be interpreted as limiting the claims. Furthermore, the claims for the method or process should not be limited to performing their steps in the written orders, and those skilled in the art can easily understand that these orders can be varied and still remain within the spirit and scope of the embodiments of the present disclosure.

In the drawings, the size of a constituent element, or the thickness or area of a layer, is sometimes exaggerated for clarity. Therefore, an embodiment of the present disclosure is not necessarily limited to the size, and the shape and dimension of each component in the drawings do not reflect real proportions. In addition, the drawings schematically show ideal examples, and an embodiment of the present disclosure is not limited to the shapes or values shown in the drawings.

Unless otherwise defined, technical terms or scientific terms used in the present disclosure have ordinary meanings understood by those of ordinary skills in the field to which the present disclosure pertains. The words "first", "second" and the like used in the present disclosure do not indicate any order, quantity or importance, but are only used to distinguish different components. In the present disclosure, "a plurality of" may indicate the number of two or more. Similar words such as "including" or "containing" mean that elements or articles appearing before the word cover elements or articles listed after the word and their equivalents, without excluding other elements or articles. Similar terms such as "connect", "couple" or "link" are not limited to physical or mechanical connections, but may include electrical connections, whether direct or indirect. "Electrical connection" includes a case where the constituent elements are connected together by an element having a certain electrical function. The "element having a certain electrical function" is not particularly limited as long as it can transmit and receive electrical signals between connected constituent elements. Examples of the "element having a certain electrical function" not only include electrodes and wirings, but also include switching elements such as transistors, resistors, inductors, capacitors, and other elements with one or more functions.

In order to keep the following description of the embodiments of the present disclosure clear and concise, detailed descriptions of some known functions and known components are omitted from the present disclosure. The accompanying drawings of the embodiments of the present disclosure only refer to structures involved in the embodiments of the present disclosure, and as to other structures, reference may be made to general designs.

At least one embodiment of the present disclosure provides a display substrate, including: a silicon-based substrate having a display area, a binding area located on one side of the display area, and a trace area located between the display area and the binding area; a trace protection structure is arranged on the silicon-based substrate in the trace area, and a pad assembly is integrated in the silicon-based substrate in the binding area; and a minimum distance between an edge of an orthographic projection of the trace protection structure on the silicon-based substrate and an edge of an orthographic projection of an opening of the pad assembly on the silicon-based substrate is smaller than a maximum size of one subpixel. The orthographic projection of the trace protection structure on the silicon-based substrate does not overlap with the orthographic projection of the opening of the pad assembly on the silicon-based substrate. The minimum distance between the edge of the orthographic projection of the trace protection structure on the silicon-based substrate and the edge of the orthographic projection of the opening of the pad assembly on the silicon-based substrate may be: an interval between an edge on one side of the orthographic projection of the trace protection structure on the silicon-based substrate away from the display area and an edge on one side of the orthographic projection of the opening of the pad assembly on the silicon-based substrate close to the display area.

In some examples, a subpixel can be a rectangle or a rounded rectangle, and the maximum size of the subpixel can be the length of the long side of the rectangle or rounded rectangle, for example, 1 to 2 microns. In some examples, a subpixel can be a square or a rounded square, and the maximum size of the subpixel can be the length of the side of the square or rounded square, for example, 1 to 2 microns. However, this is not limited in the present embodiment. For example, the subpixel can have other shapes, and the maximum size of the subpixel can be the maximum value among the parameters characterizing the shape of the subpixel.

There is no electrical connection between the trace protection structure and the pad assembly according to this embodiment, which can protect signal lines covered by the orthographic projection of the trace protection structure on the silicon-based substrate during the preparation process of the display substrate.

In some exemplary embodiments, the pad assembly includes a plurality of strip-shaped binding electrodes arranged at intervals; and the trace protection structure includes: a plurality of strip-shaped metal protection blocks arranged at intervals. The metal protection blocks correspond to the binding electrodes one by one, and a minimum distance between an edge of an orthographic projection of each metal protection block on the silicon-based substrate and an edge of an orthographic projection of an opening of the corresponding binding electrode on the silicon-based substrate is smaller than the maximum size of one subpixel. In some examples, an edge on one side of the orthographic projection of each metal protection block on the silicon-based substrate away from the display area may coincide with an edge on one side of the orthographic projection of the opening of the corresponding binding electrode on the silicon-based substrate close to the display area, that is, the interval between the two edges may be 0; or the two edges do not coincide, and the interval between the two edges may be smaller than the maximum size of one subpixel, for example, 1 to 2 microns. In this exemplary embodiment, the metal protection blocks in the trace protection structure are insulated from the binding electrodes, and there is no electrical connection between them. The metal protection blocks can protect signal lines covered by the orthographic projections of the metal protection blocks on the silicon-based substrate during the preparation process of the display substrate.

In some exemplary embodiments, the length of the metal protection block ranges from 150 to 250 microns in a direction from the binding area to the display area. In some examples, the lengths of the plurality of metal protection blocks are all the same, e.g., 200 microns.

In some exemplary embodiments, an array structure layer is arranged on the silicon-based substrate in the display area. The array structure layer in the display area includes: a first insulating layer arranged on the silicon-based substrate, a reflective electrode arranged on the first insulating layer, and a second insulating layer covering the reflective electrode. The first insulating layer is provided with a first via exposing a driving transistor of the silicon-based substrate, a first conductive pillar is arranged in the first via, the reflective electrode is connected with the driving transistor through the first conductive pillar. The second insulating layer is provided with a second via exposing the reflective electrode, and a second conductive pillar connected with the reflective electrode is arranged in the second via.

In some exemplary embodiments, a light emitting structure layer is arranged on the array structure layer in the display area, and the light emitting structure layer in the display area includes: an anode arranged on the second insulating layer, an organic light emitting layer connected with the anode and a cathode connected with the organic light emitting layer. The anode is connected with the reflective electrode by the second conductive pillar. The orthographic projection of the anode on the silicon-based substrate at least partially overlaps with the orthographic projection of the organic light emitting layer on the silicon-based substrate. The anode may be in direct contact with the organic light emitting layer, for example, the organic light emitting layer is directly formed on the anode. The cathode may be a planar structure and directly covers the organic light emitting layer. In this exemplary embodiment, in the display area, a conductive path between a pixel driving circuit and the anode is realized through the array structure layer, so as to provide an electrical signal provided by the pixel driving circuit to the anode.

In some exemplary embodiments, the pad assembly integrated in the silicon-based substrate in the binding area is configured to be bound to a flexible printed circuit. The trace protection structure is arranged on the same layer as the reflective electrode in the array structure layer in the display area, or the trace protection structure is arranged on the same layer as the anode in the light emitting structure layer in the display area. The trace protection structure can be located above the pad assembly, and there is no electrical connection between them. The trace protection structure can be formed by the same patterning process as the reflective electrode of a metal material, or can be formed by the same patterning process as the anode of a metal material.

In some exemplary embodiments, an array structure layer is arranged on the silicon-based substrate in the binding area, and an auxiliary pad assembly for binding to a flexible printed circuit is arranged on the array structure layer in the binding area. The array structure layer in the binding area includes a first insulating layer arranged on the silicon-based substrate, the first insulating layer is provided with a third via exposing the pad assembly of the silicon-based substrate, a third conductive pillar connected with the pad assembly is arranged in the third via, and the auxiliary pad assembly is arranged on the first insulating layer and is connected with the pad assembly through the third conductive pillar. The trace protection structure is arranged on the same layer as the anode in the light emitting structure layer in the display area. In some examples, the minimum distance between the edge of the orthographic projection of the trace protection structure on the silicon-based substrate and the edge of the orthographic projection of an opening of the auxiliary pad assembly on the silicon-based substrate may be smaller than the maximum size of one subpixel. In some examples, when the auxiliary pad assembly is completely exposed, the minimum distance between the edge of the orthographic projection of the trace protection structure on the silicon-based substrate and an edge of the orthographic projection of the auxiliary pad assembly on the silicon-based substrate may be smaller than the maximum size of one subpixel. In this exemplary embodiment, the auxiliary pad assembly is arranged on the same layer as the reflective electrode of a metal material of the array structure layer in the display area.

In some exemplary embodiments, the auxiliary pad assembly includes a plurality of strip-shaped auxiliary binding electrodes arranged at intervals, and one auxiliary binding electrode is connected with one strip-shaped binding electrode in the pad assembly through the third conductive pillar; or the auxiliary pad assembly includes a plurality of auxiliary binding electrodes arranged in an array, and the plurality of auxiliary binding electrodes are respectively connected with one strip-shaped binding electrode through a plurality of third conductive pillars.

In some exemplary embodiments, a photoresist layer is arranged on the trace protection structure.

Embodiments of the present disclosure and examples thereof will be described below in detail with reference to the accompanying drawings.

At least one embodiment of the present disclosure provides a display substrate. For example, the display substrate is a silicon-based OLED display substrate, which can be applied to a virtual reality device or an augmented reality device, or can be other types of display substrates, which is not limited in the embodiments of the present disclosure.

FIG. 1 is a schematic plan view of a display substrate according to at least one embodiment of the present disclosure. As shown in FIG. 1, the display substrate includes a display area 100, a peripheral area 200 located at a periphery of the display area 100, and a binding area 300 located on one side of the peripheral area 200 away from the display area 100. The peripheral area 200 may include a trace area located between the display area 100 and the binding area 300, and a trace protection structure 40 may be arranged in the trace area. A pad assembly 301 is arranged in the binding area 300. As shown in FIG. 1, the edge on one side of the pad assembly 301, which is exposed through the opening, close to the display area 100 can be connected with the edge on one side of the orthographic projection of the trace protection structure 40 on the silicon-based substrate 10 away from the display area 100, that is, the interval between the edges is 0. The trace protection structure of this embodiment can protect signal lines on one side of the pad assembly close to the display area in the silicon-based substrate during the preparation process of the display substrate.

Figure 2:
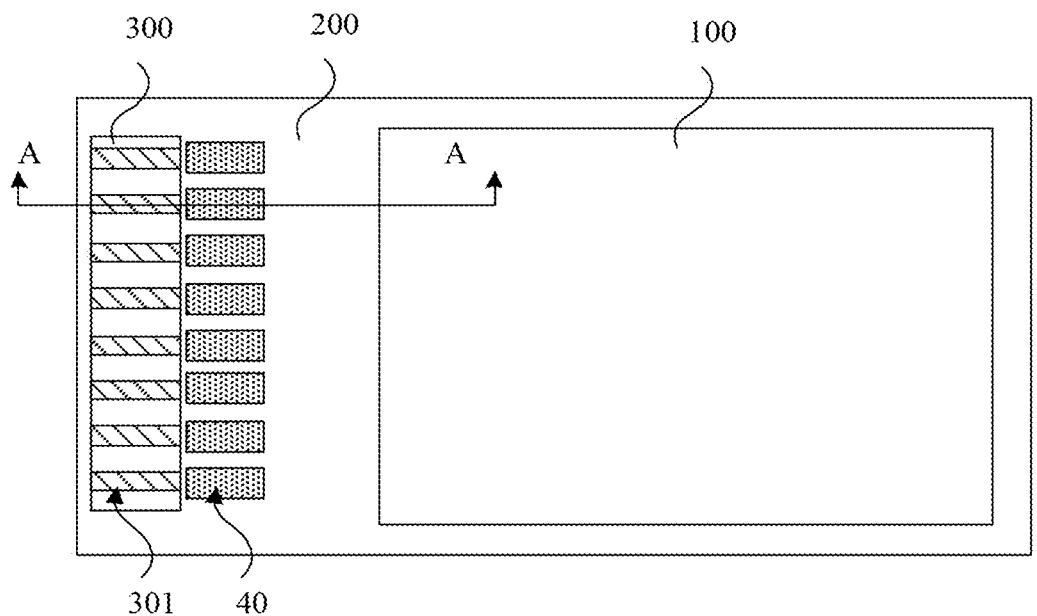
FIG. 2 is a schematic plan view of a display substrate according to at least one embodiment of the present disclosure.
Figure 3:
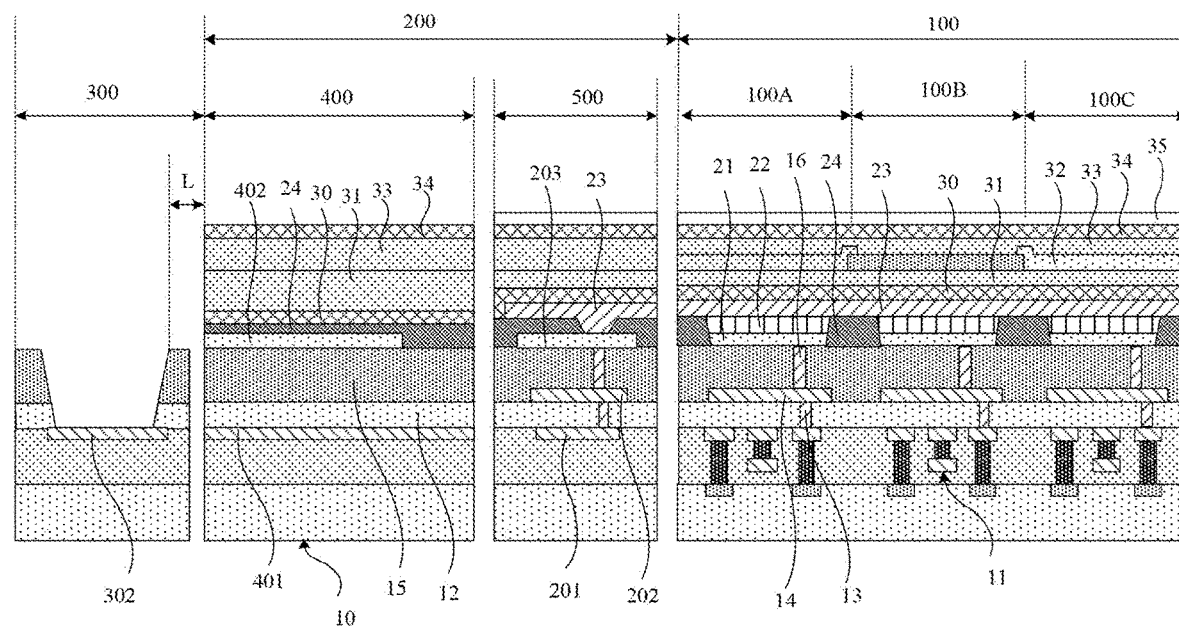
FIG. 3 is a schematic sectional view of the display substrate in FIG. 2 taken in an AA direction.

FIG. 2 is a schematic plan view of a display substrate according to at least one embodiment of the present disclosure. FIG. 3 is a sectional view of the display substrate in FIG. 2 taken in an A-A direction. As shown in FIGS. 2 and 3, the display substrate includes a display area 100, a peripheral area 200 located at the periphery of the display area 100, and a binding area 300 located on one side of the peripheral area 200 away from the display area 100. The peripheral area 200 may include: a trace area 400 located between the display area 100 and the binding area 300, and a cathode ring area 500 located between the trace area 400 and the display area 100 and surrounding the display area 100. The peripheral area 200 may further include: a first Dummy area surrounding the display area 100, and a second dummy area surrounding the cathode ring area 500. The display area 100 may be a rectangular area, the first dummy area, the cathode ring area 500 and the second dummy area sequentially surround the periphery of the display area 100, and the trace area 400 and the binding area 300 are located on one side of the display area 100. The structures of the first dummy area and the second dummy area are omitted in FIG. 2. However, this is not limited in the present embodiment. The display area 100 may also be a rounded rectangle, a circle, a rectangle with an opening, or other shapes.

In this embodiment, a plurality of display units (i.e., subpixels) arranged regularly are provided in the display area 100, a control circuit (not shown) for driving the display units to emit light is arranged in the peripheral area 200, a pad assembly 301 is arranged in the binding area 300, and a trace protection structure 40 is arranged in the trace area 400. As shown in FIG. 2, there is an interval L between the edge on one side of the orthographic projection of the pad assembly 301, which is exposed through the opening, on the silicon-based substrate 10 close to the display area 100 and the edge on one side of the orthographic projection of the trace protection structure 40 on the silicon-based substrate 10 away from the display area 100. The interval L is the minimum distance between the edge of the orthographic projection of the trace protection structure 40 on the silicon-based substrate 10 and the orthographic projection of the opening of the pad assembly 301 on the silicon-based substrate 10. The interval L may be smaller than the maximum size of one subpixel.

In a plane perpendicular to the display substrate, the display substrate includes a silicon-based substrate 10 and an array structure layer arranged on the silicon-based substrate 10. A light emitting structure layer, a first encapsulation layer 30, a first flat layer 31, a color filter layer 32, a second flat layer 33 and a second encapsulation layer 34 are arranged on the array structure layer in the display area 100. The array structure layer in the binding area 300 exposes the pad assembly 301. A trace protection structure 40, a first encapsulation layer 30, a first flat layer 31, a second flat layer 33 and a second encapsulation layer 34 are arranged on the array structure layer in the trace area 400. A cathode ring, a first encapsulation layer 30, a first flat layer 31, a second flat layer 33 and a second encapsulation layer 34 are arranged on the array structure layer in the cathode ring area 500.

The silicon-based substrate 10 is also called an IC wafer, on which a pixel driving circuit for generating a driving signal, a gate driving circuit for generating a gate driving signal and a data driving circuit for generating a data signal are integrated. A pixel driving circuit is arranged in the silicon-based substrate 10 in the display area 100. The pixel driving circuit may be a 2T1C, 3T1C, 5T1C or 7T1C circuit structure, or may be a circuit structure with an internal compensation or external compensation function. The pixel driving circuit includes at least a driving transistor 11.

The array structure layer in the display area 100 includes a first insulating layer 12 arranged on the silicon-based substrate 10, a reflective electrode 14 arranged on the first insulating layer 12, and a second insulating layer 15 covering the reflective electrode 14. The first insulating layer 12 is provided with a first via exposing the driving transistor 11 of the silicon-based substrate 10, a first conductive pillar 13 is arranged in the first via, the reflective electrode 14 is connected with the driving transistor 11 through the first conductive pillar 13. The second insulating layer 15 is provided with a second via exposing the reflective electrode 14, and a second conductive pillar 16 connected with the reflective electrode 14 is arranged in the second via.

The light emitting structure layer in the display area 100 includes an anode 21, a pixel definition layer 24, an organic light emitting layer 22 and a cathode 23 which are arranged on the array structure layer. The first encapsulation layer 30 covers the cathode 23, and the anode 21 is arranged on the second insulating layer 15 and is connected with the reflective electrode 14 through the second conductive pillar 16. The boundary of the organic light emitting layer 22 may be located in the first dummy area, and the boundary of the cathode 23 may be located in the cathode ring area 500.

In some examples, the first dummy area may include an array structure layer (including a first insulating layer and a second insulating layer which are stacked), a light emitting structure layer (including an anode, a pixel definition layer, an organic light emitting layer and a cathode which are arranged on the second insulating layer), a first encapsulation layer, a first flat layer, a color filter layer, a second flat layer and a second encapsulation layer which are stacked on the silicon-based substrate 10.

The pad assembly 301 is exposed on the silicon-based substrate 10 in the binding area 300. The pad assembly 301 includes a plurality of strip-shaped binding electrodes 302 arranged at intervals, and can be configured to be bound to a flexible printed circuit.

A signal line 401 is integrated in the silicon-based substrate 10 in the trace area 400, and the signal line 401 can be connected with the binding electrode 302 in the binding area 300 (the connection position between the signal line 401 and the binding electrode 302 is omitted in the drawing). The signal line 401 may transmit a signal, input through the binding electrode 302, to the circuits in the peripheral area 200 and the display area 100. For example, the signal line 401 may also be connected with a power supply electrode 201 in the cathode ring area 500. In some examples, the signal line 401 may be arranged on the same layer as the binding electrode 302. In some examples, the signal line 401 integrated in the silicon-based substrate 10 in the trace area 400 may not be exposed from the surface of the silicon-based substrate 10. However, this is not limited in the present embodiment.

The array structure layer in the trace area 400 includes a first insulating layer 12 and a second insulating layer 15 which are stacked on the silicon-based substrate 10. The trace protection structure 401 in the trace area 400 includes a plurality of strip-shaped metal protection blocks 402 arranged at intervals. The metal protection blocks 402 correspond to the binding electrodes 302 one by one, and the orthographic projection of each metal protection block 402 on the silicon-based substrate 10 can cover the signal line close to the corresponding binding electrode 302. The interval L between the edge on one side of the orthographic projection of the metal protection block 402 on the silicon-based substrate 10 away from the display area 100 and the edge on one side of the orthographic projection of the opening of the binding electrode 302 on the silicon-based substrate 10 close to the display area 100 may be smaller than the maximum size of one subpixel. In some examples, the plurality of metal protection blocks 402 have the same size. In some examples, in the direction from the binding area 300 to the display area 100 (i.e., a first direction), the length of each metal protection block 402 may range from 150 to 250 microns, e.g., 200 microns. In a second direction which is in the same plane as the first direction and perpendicular to the first direction, the length of each metal protection block 402 can range from 80 to 100 microns, e.g., 90 microns. In the second direction, the interval between two adjacent metal protection blocks 402 may be 40 microns. However, this is not limited in the present embodiment.

The array structure layer in the cathode ring area 500 includes a first insulating layer 12 arranged on the silicon-based substrate 10, a first connection electrode 202 arranged on the first insulating layer 12, and a second insulating layer 15 covering the first connection electrode 202. The first insulating layer 12 is provided with a first via exposing a power supply electrode 201 of the silicon-based substrate 10, a first conductive pillar 13 is arranged in the first via, and the first connection electrode 202 is connected with the power supply electrode 201 through the first conductive pillar 13. The second insulating layer 15 is provided with a second via exposing the first connection electrode 202, and a second conductive pillar 16 connected with the first connection electrode 202 is arranged in the second via. The cathode ring arranged on the array structure layer in the cathode ring area 500 includes a second connection electrode 203, a pixel definition layer 24 and a cathode 23 which are stacked on the second insulating layer 15. The pixel definition layer 24 is provided with a cathode via exposing the second connection electrode 203. The second connection electrode 203 is connected with the first connection electrode 201 through the second conductive pillar 16, and the cathode 23 is connected with the second connection electrode 203 through the cathode via.

In some examples, the second dummy area between the trace area 400 and the cathode ring area 500 may include an array structure layer (including a first insulating layer and a second insulating layer which are stacked), a pixel definition layer, a first encapsulation layer, a first flat layer, a second flat layer and a second encapsulation layer which are stacked on the silicon-based substrate 10.

The display substrate according to an exemplary embodiment of the present disclosure realizes full-color display by white light+color filters. A Color Filter (CF) layer 31 located in the display area 100 is arranged on the first flat layer 31, and includes a first color unit, a second color unit and a third color unit corresponding to the display units. In an exemplary embodiment of the present disclosure, a high resolution of more than 2000 can be realized by adopting a mode of combination of white light and color filters, which can meet the requirement of VR/AR.

Figure 4:
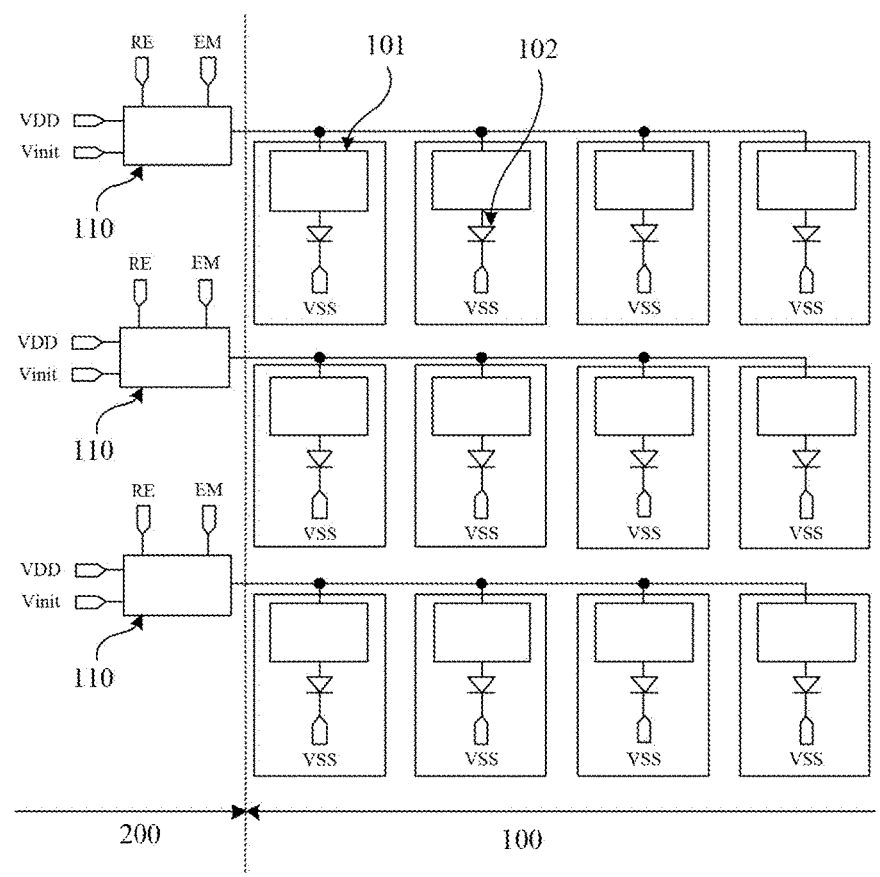
FIG. 4 is a schematic diagram of a circuit principle of a silicon-based substrate according to at least one embodiment of the present disclosure.

FIG. 4 is a schematic diagram of a circuit principle of a silicon-based substrate according to at least one embodiment of the present disclosure. As shown in FIG. 4, the silicon-based substrate 10 includes a plurality of display units in the display area 100 and a control circuit in the peripheral area 200. The plurality of display units in the display area 100 are regularly arranged to form a plurality of display rows and a plurality of display columns. Each display unit includes a pixel driving circuit 101 and a light emitting device 102 connected with the pixel driving circuit 101. The pixel driving circuit 101 includes at least a driving transistor. The control circuit includes at least a plurality of voltage control circuits 110 each connected with a plurality of pixel driving circuits 101. For example, one voltage control circuit 110 is connected to the pixel driving circuits 101 in one display row, first poles of the driving transistors in pixel driving circuits 101 in this display row are collectively connected to this voltage control circuit 110, a second pole of each driving transistor is connected to an anode of the light emitting device 102 of the display unit in which the driving transistor is located, and the cathode of the light emitting device 102 is connected to an input end of a second power source signal VSS. The voltage control circuits 110 are respectively connected to an input end of a first power source signal VDD, an input end of an initialization signal Vinit, an input end of a reset control signal RE and an input end of a light emitting control signal EM. The voltage control circuit 110 is configured to output, in response to a reset control signal RE, an initialization signal Vinit to the first pole of the driving transistor to control a corresponding light emitting device 102 to reset. The voltage control circuit 110 is further configured to output, in response to a light emitting control signal EM, a first power source signal VDD to the first pole of the driving transistor to drive a light emitting device 102 to emit light. By collectively connecting the pixel driving circuits 101 in one display row to the voltage control circuit 110, the structure of each pixel driving circuit 101 in the display area 100 can be simplified, and the occupied area of the pixel driving circuits 101 in the display area 100 can be reduced, so that more pixel driving circuits 101 and light emitting devices 102 can be arranged in the display area 100, thereby realizing high PPI display. Under the control of the reset control signal RE, the voltage control circuit 110 outputs an initialization signal Vinit to the first pole of the driving transistor to control the corresponding light emitting device 102 to reset, which can prevent the voltage applied to the light emitting device 102 during light emission of a frame from affecting light emission of a next frame, and can improve image retention.

In an exemplary embodiment, three display units of different colors constitute one pixel. The three display units may be a red display unit, a green display unit and a blue display unit, respectively. In some possible implementations, one pixel may include four, five or more display units, which can be designed and determined according to the actual application environment, and is not limited here. In some possible implementations, one voltage control circuit 110 may be connected to the pixel driving circuits 101 in two adjacent display units in the same display row, or may be connected to the pixel driving circuits 101 in three or more display units in the same display row, which is not limited here.

Figure 5:
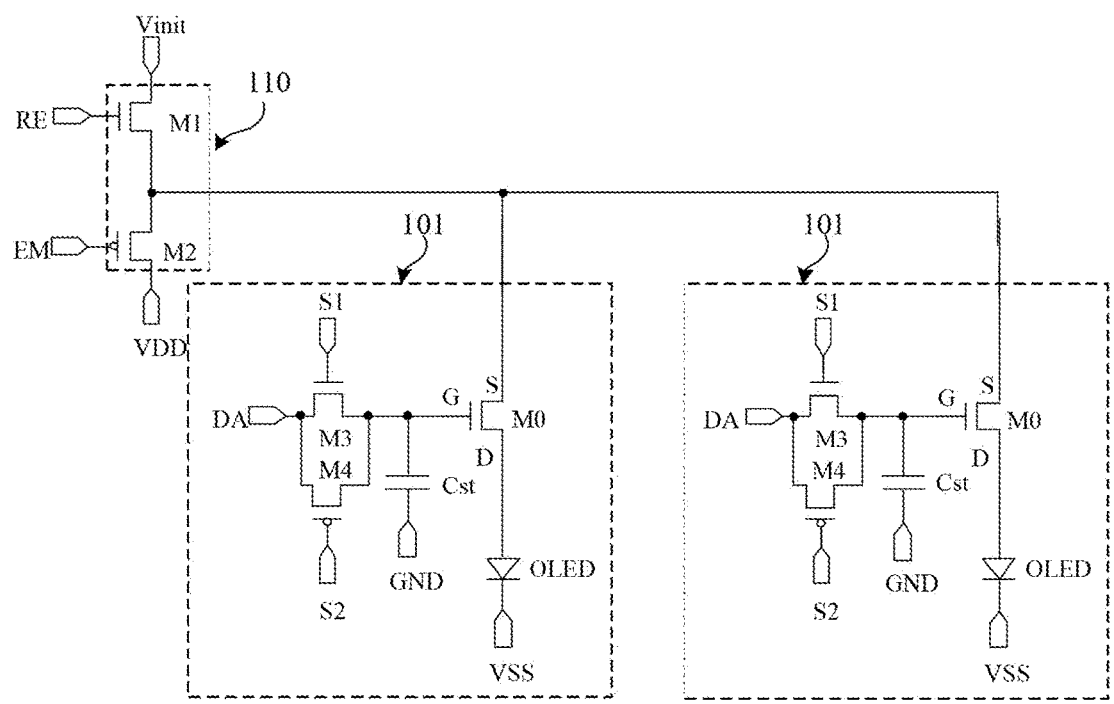
FIG. 5 is a schematic diagram of a circuit implementation of a voltage control circuit and a pixel driving circuit according to at least one embodiment of the present disclosure.

FIG. 5 is a schematic diagram of a circuit implementation of a voltage control circuit and a pixel driving circuit according to at least one embodiment of the present disclosure. As shown in FIG. 5, the light emitting device may include an OLED. An anode of the OLED is connected with a second pole D of a driving transistor M0, and a cathode of the OLED is connected with an input end of a second power source signal VSS. The voltage of the second power source signal VSS generally may be a negative voltage or a ground voltage VGND (generally 0 V). The voltage of the initialization signal Vinit may also be a ground voltage VGND In an exemplary embodiment, the OLED may be a Micro-OLED or a Mini-OLED, which is beneficial to the realization of high PPI display.

In an exemplary embodiment, the voltage control circuit 110 is connected with two pixel driving circuits 101 in one display row. The pixel driving circuit 101 includes a driving transistor M0, a third transistor M3, a fourth transistor M4 and a storage capacitor Cst, and the voltage control circuit 110 includes a first transistor M1 and a second transistor M2. The driving transistor M0, the first transistor M1, the second transistor M2, the third transistor M3 and the fourth transistor M4 are all Metal Oxide Semiconductor (MOS) field-effect transistors prepared in a silicon-based substrate.

A control pole of the first transistor M1 is connected to the input end of the reset control signal RE and is configured to receive a reset control signal RE, a first pole of the first transistor M1 is connected to the input end of the initialization signal Vinit and is configured to receive an initialization signal Vinit, and a second pole of the first transistor M1 is connected to a first pole S of the corresponding driving transistor M0 and a second pole of the second transistor M2. A control pole of the second transistor M2 is connected to the input end of the light emitting control signal EM and is configured to receive a light emitting control signal EM, a first pole of the second transistor M2 is connected to the input end of the first power source signal VDD and is configured to receive a first power source signal VDD, and the second pole of the second transistor M2 is connected to the first pole S of the corresponding driving transistor M0 and the second pole of the first transistor M1. In an exemplary embodiment, the types of the first transistor M1 and the second transistor M2 may be different, for example, the first transistor M1 is an N-type transistor and the second transistor M2 is a P-type transistor, or the first transistor M1 is a P-type transistor and the second transistor M2 is an N-type transistor. In some possible implementations, the types of the first transistor M1 and the second transistor M2 may be the same, which can be designed and determined according to actual situation, and is not limited here.

The pixel driving circuit 101 includes a driving transistor M0, a third transistor M3, a fourth transistor M4 and a storage capacitor Cst. The control pole G of the driving transistor M0 and the first pole S of the driving transistor M0 are connected to the second pole of the first transistor M1 and the second pole of the second transistor M2, and the second pole D of the driving transistor M0 is connected to the anode of the OLED. The control pole of the third transistor M3 is connected to an input end of a first control pole scanning signal S1 and is configured to receive a first control pole scanning signal S1, the first pole of the third transistor M3 is connected to an input end of a data signal DA and is configured to receive a data signal DA, and the second pole of the third transistor M3 is connected to the control pole G of the driving transistor M0. The control pole of the fourth transistor M4 is connected to an input end of a second control pole scanning signal S2 and is configured to receive a second control pole scanning signal S2, the first pole of the fourth transistor M4 is connected to the input end of the data signal DA and is configured to receive a data signal DA, and the second pole of the fourth transistor M4 is connected to the control pole G of the driving transistor M0. A first end of the storage capacitor Cst is connected to the control pole G of the driving transistor M0, and a second end of the storage capacitor Cst is connected to the ground end GND. In an exemplary embodiment, the driving transistor M0 may be an N-type transistor, and the types of the third transistor M3 and the fourth transistor M4 may be different, for example, the third transistor M3 is an N-type transistor and the fourth transistor M4 is a P-type transistor. When the voltage of the data signal DA is a voltage corresponding to a high gray scale, the P-type fourth transistor M4 is turned on to transmit the data signal DA to the control pole G of the driving transistor M0, which can prevent the voltage of the data signal DA from being affected by, for example, a threshold voltage of the N-type third transistor M3. When the voltage of the data signal DA is a voltage corresponding to a low gray scale, the N-type third transistor M3 is turned on to transmit the data signal DA to the control pole G of the driving transistor M0, which can prevent the voltage of the data signal DA from being affected by a threshold voltage of the P-type fourth transistor M4. In this way, it is possible to increase a range of the voltage input to the control pole G of the driving transistor M0. In some possible implementations, the types of the third transistor M3 and the fourth transistor M4 may be that: the third transistor M3 is a P-type transistor and the fourth transistor M4 is an N-type transistor. In some possible implementations, the pixel driving circuit may be a 3T1C, 5T1C or 7T1C circuit structure, or may be a circuit structure with an internal compensation or external compensation function, which is not limited in the present embodiment.

The technical solution of this embodiment is described below by an example of a preparation process of the display substrate. In this embodiment, the "patterning process" includes the treatments, such as film layer deposition, photoresist coating, mask exposure, development, etching, and photoresist stripping, which is a known mature preparation process. Deposition may be implemented by using a known process, such as sputtering, evaporation and chemical vapor deposition, coating may be implemented by using a known coating process, and etching may be implemented by using a known method, which is not limited here. In the description of this embodiment, it should be understood that "thin film" refers to a layer of thin film fabricated by a certain material on a base substrate by using a deposition or coating process. If the "thin film" does not require a patterning process or a photolithography process during the whole fabrication process, the "thin film" can also be called a "layer". If the "thin film" also requires a patterning process or a photolithography process throughout the fabrication process, it is referred to as a "thin film" before the patterning process and as a "layer" after the patterning process. The "layer" after a patterning process or a photolithography process contains at least one "pattern". In the present disclosure, "A and B being arranged on the same layer" means that A and B are formed at the same time by the same patterning process.

(1) A silicon-based substrate is prepared. The silicon-based substrate includes: a display area 100, a peripheral area 200 located at the periphery of the display area 100, and a binding area 300 located on one side of the peripheral area 200 away from the display area 100. The peripheral area 200 includes a trace area 400 and a cathode ring area 500 located between the display area 100 and the binding area 300. The peripheral area 200 may also include: a first dummy area surrounding the display area 100, and a second dummy area (not shown) surrounding the cathode ring area 500.

The display area 100 includes a plurality of display units. The silicon-based substrate 10 of each display unit is integrated with a pixel driving circuit, the silicon-based substrate 10 in the peripheral area 200 is integrated with a control circuit for driving the display units to emit light, and the silicon-based substrate 10 in the binding area 300 is integrated with a pad assembly for binding to a flexible printed circuit (FPC) or a Wire. The silicon-based substrate 10 in the binding area 300 exposes the pad assembly, and the pad assembly includes a plurality of binding electrodes. The silicon-based substrate 10 in the trace area 400 is integrated with a signal line 401 connected with the pad assembly, and the signal line 401 in the trace area 400 can connect the pad assembly with the pixel driving circuit and the control circuit. A power supply assembly is integrated in the silicon-based substrate 10 in the cathode ring area 500.

Figure 6:
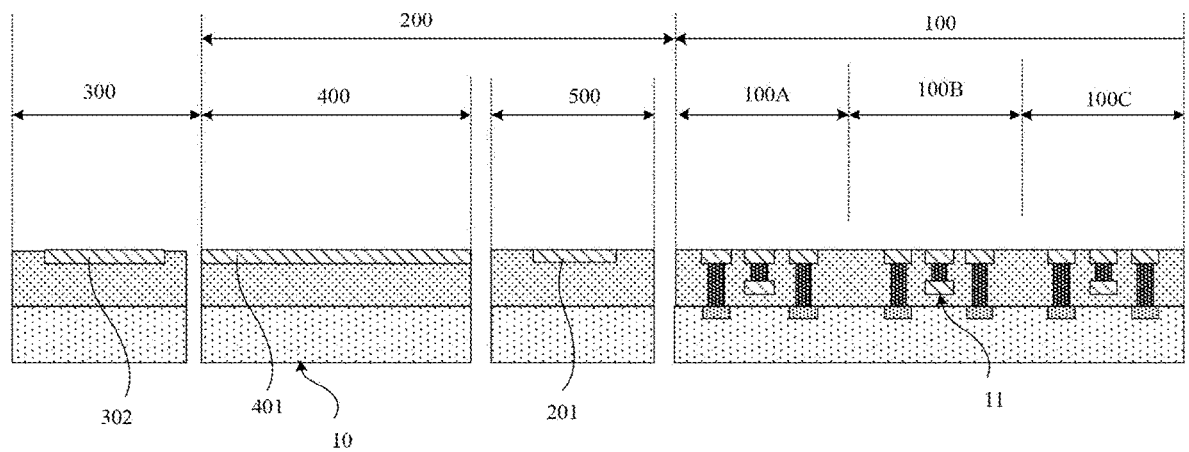
FIG. 6 is a schematic diagram of a structure after a silicon-based substrate is formed according to at least one embodiment of the present disclosure.

As an exemplary illustration, in FIG. 6, the display area 100 is represented by a first display unit 100A, a second display unit 100B and a third display unit 100C, the pixel driving circuit of the silicon-based substrate 10 in each display unit is represented by a driving transistor 11, the power supply assembly of the silicon-based substrate 10 in the cathode ring area 500 is represented by a power supply electrode 201, and the pad assembly of the silicon-based substrate 10 in the binding area 300 is represented by a binding electrode 302.

In an exemplary embodiment, the driving transistor in the display area 100 includes an active layer, a gate electrode, a source electrode, a drain electrode and a gate connection electrode. The source electrode and the drain electrode are respectively connected with a doped region of the active layer through conductive pillars, and the gate connection electrode is connected with the gate electrode through a conductive pillar. The pad assembly in the binding area 300 and the power supply assembly in the cathode ring area 500 are arranged on the same layer as the source electrode, the drain electrode and the gate connection electrode. The silicon-based substrate may be prepared by mature CMOS integrated circuit technology, which is not limited in this embodiment. After the completion of the preparation, the source electrode, the drain electrode and the gate connection electrode in the display area 100, the binding assembly 302 of the pad assembly in the binding area 300 and the power supply electrode 201 of the power supply assembly in the cathode ring area 500 are exposed on the surface of the silicon-based substrate 10.

In an exemplary embodiment, a material of the silicon-based substrate may be any one or more of silicon, germanium and compound semiconductors. The compound semiconductors may include any one or more of silicon germanium, silicon carbide, gallium arsenide, gallium phosphide, indium phosphide, indium arsenide and indium antimonide. The silicon-based substrate may be doped or undoped.

Figure 7:
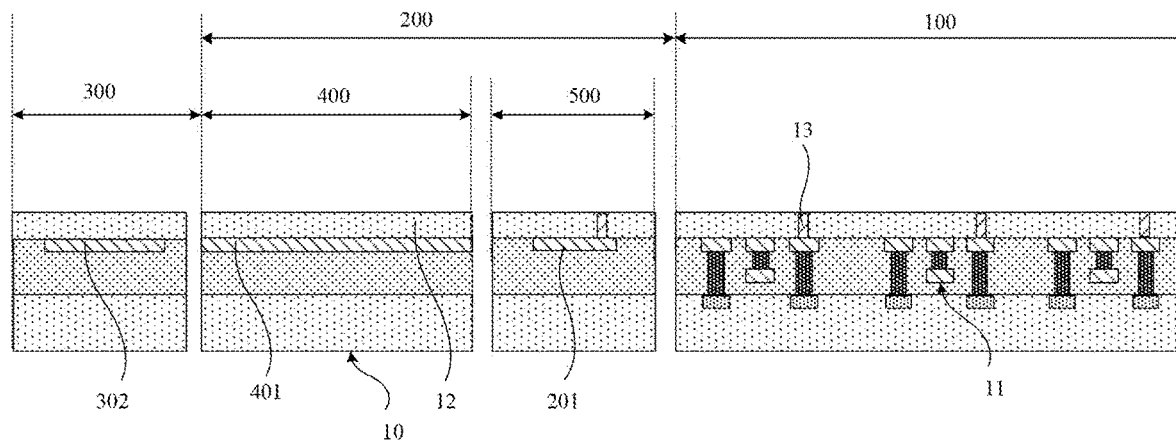
FIG. 7 is a schematic diagram of a structure after a first conductive pillar is formed according to at least one embodiment of the present disclosure.

(2) A first insulating thin film is deposited on the silicon-based substrate 10. The first insulating thin film is patterned by a patterning process to form a pattern of a first insulating layer 12 covering the silicon-based substrate 10. The first insulating layer 12 in the display area 100 and the cathode ring area 500 is formed with a plurality of first vias. A plurality of first vias in the display area 100 respectively expose the drain electrode of each display unit, and each first via in the cathode ring area 500 exposes a power supply electrode 201. Then, a plurality of first conductive pillars 13 are formed in the first vias on the first insulating layer 12. The first conductive pillars 13 in the first vias in the display area 100 are connected with the drain electrodes of the display units where the first conductive pillars 13 are located, and the first conductive pillars 13 in the first vias in the cathode ring area 500 are connected with the power supply electrodes 201, as shown in FIG. 7.

In an exemplary embodiment, the first conductive pillar 13 may be made of a metal material. After the formation of the first conductive pillars 13 by a filling treatment, polishing treatment may also be carried out to corrode and rub the surfaces of the first insulating layer 12 and the first conductive pillars 13 by a polishing process to remove part of the thickness of the first insulating layer 12 and the first conductive pillars 13, so that the first insulating layer 12 and the first conductive pillars 13 have flush surfaces. In some possible implementations, tungsten (W) may be used for the first conductive pillar 13, and the via filled with tungsten is called a W-via. When the thickness of the first insulating layer is relatively large, the use of W-vias may ensure stability of the conductive path. Due to the mature process for fabricating W-vias, the resultant first insulating layer 12 has good surface flatness, which is beneficial to reducing contact resistance. W-vias are not only suitable for connection between the silicon-based substrate and the reflective electrodes, but also suitable for connection between the reflective electrodes and the anodes, and connection between other wiring layers.

Figure 8:
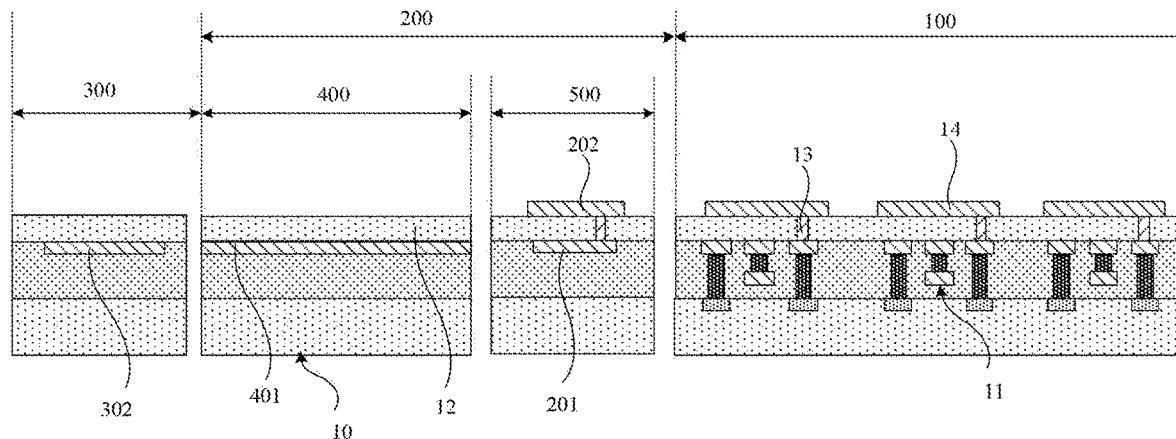
FIG. 8 is a schematic diagram of a structure after a reflective electrode is formed according to at least one embodiment of the present disclosure.

(3) A first metal thin film is deposited on the silicon-based substrate 10 on which the above structure is formed. The first metal thin film is patterned by a patterning process to form a pattern of a reflective electrode 14 on the first insulating layer 12 in the display area 100, the reflective electrode 14 is connected with the drain electrode through the first conductive pillar 13 in each display unit; a first connection electrode 202 is formed on the first insulating layer 12 in the cathode ring area 500, the first connection electrode 202 is connected with the power supply electrode 201 through the first conductive pillar 13, as shown in FIG. 8.

In this patterning process, the film layer structures of the binding area 300 and the trace area 400 are not changed. The binding area 300 includes a silicon-based substrate 10 provided with a binding electrode 302, and a first insulating layer 12 covering the silicon-based substrate 10. The trace area 400 includes a silicon-based substrate 10 and a first insulating layer 12 covering the silicon-based substrate 10.

Figure 9:
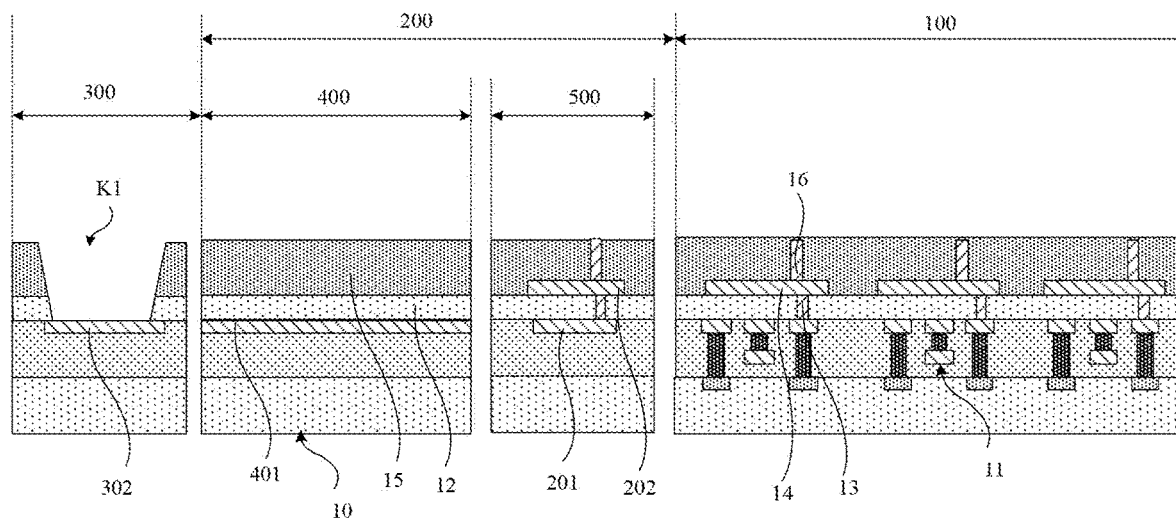
FIG. 9 is a schematic diagram of a structure after a second conductive pillar is formed according to at least one embodiment of the present disclosure.

(4) A second insulating thin film is deposited on the silicon-based substrate 10 on which the aforementioned structure is formed. The second insulating thin film is patterned by a patterning process to form a pattern of a second insulating layer 15 covering the silicon-based substrate 10. The second insulating layer 15 in the display area 100 and the cathode ring area 500 is formed with a plurality of second vias respectively exposing the reflective electrode 14 of each display unit and the first connection electrode 202 in the cathode ring area 500. A plurality of openings K1 are formed in the second insulating layer 12 in the binding area 300. The first insulating layer 12 and the second insulating layer 15 in the openings K1 are etched to expose a plurality of binding electrodes 302 on the silicon-based substrate 10. Then, a plurality of second conductive pillars 16 are formed in the plurality of second vias on the second insulating layer 12. The second conductive pillars 16 in the second vias in the display area 100 are connected with the reflective electrodes 14 of the display units where the second conductive pillars 16 are located, and the second conductive pillars 16 in the second vias in the cathode ring area 500 are connected with the first connection electrodes 202, as shown in FIG. 9. In some examples, the opening K1 may expose the entire surface of the binding electrode 302, or the opening K1 may only expose part of the surface of the binding electrode 302. In some examples, the orthographic projection of the opening K1 on the silicon-based substrate 10 may coincide with the binding electrode 302 exposed by the opening K1, or the binding electrode 302 exposed by the opening K1 may be located within the orthographic projection of the opening K1 on the silicon-based substrate 10.

In an exemplary embodiment, the second conductive pillar 16 may be made of a metal material. After the formation of the second conductive pillars 16 by a filling treatment, polishing treatment may also be carried out to corrode and rub the surfaces of the second insulating layer 15 and the second conductive pillars 16 by a polishing process to remove part of the thickness of the second insulating layer 15 and the second conductive pillars 16, so that the second insulating layer 15 and the second conductive pillars 16 have flush surfaces. In some possible implementations, tungsten (W) may be used for the second conductive pillars 16.

Figure 10:
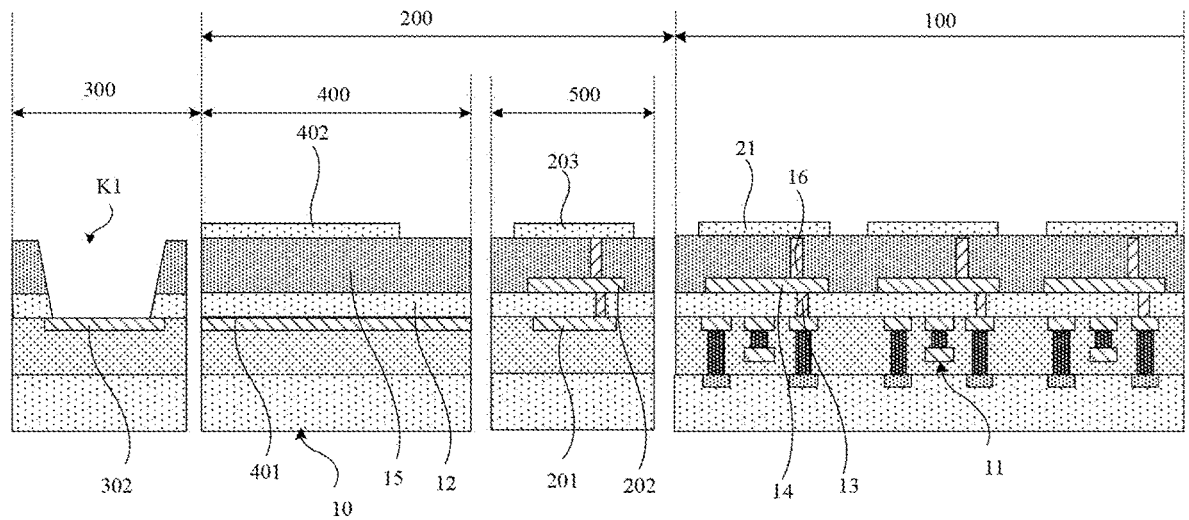
FIG. 10 is a schematic diagram of a structure after an anode is formed according to at least one embodiment of the present disclosure.

(5) A second metal thin film is deposited on the silicon-based substrate 10 on which the above structure is formed. The second metal thin film is patterned by a patterning process to form a pattern of an anode 21 on the second insulating layer 15 in the display area 100, a pattern of a trace protection structure on the second insulating layer 15 in the trace area 400, and a pattern of a second connection electrode 203 on the second insulating layer 15 in the cathode ring area 500, as shown in FIG. 10.

In each display unit in the display area 100, the anode 21 is connected with the reflective electrode 14 through the second conductive pillar 16, and the reflective electrode 14 is connected with the drain electrode of the driving thin film transistor 11 through the first conductive pillar 13. In this way, an electrical signal provided by the pixel driving circuit is transmitted to the anode 21 through the reflective electrode 14, and a conductive channel between the pixel driving circuit and the anode 21 can be formed by the reflective electrode 14.

The second connection electrode 203 in the cathode ring area 500 is connected with the first connection electrode 201 through the second conductive pillar 16, and the first connection electrode 202 is connected with the power supply electrode 201 through the first conductive pillar 13.

The trace protection structure in the trace area 400 includes metal protection blocks 402 corresponding to the binding electrodes 302 one by one. The orthographic projection of each metal protection block 402 on the silicon-based substrate 10 can cover the signal line 401 on a side close to the corresponding binding electrode 302. The metal protection block 402 is configured to protect the signal line 401 on a side close to the binding electrode 302. In some examples, the minimum distance between the edge of the orthographic projection of the metal protection block 402 on the silicon-based substrate 10 and the edge of the orthographic projection of the opening K1 on the silicon-based substrate 10 may be smaller than the maximum size of one subpixel, for example, 1 to 2 microns (um). In some examples, an edge on one side of the orthographic projection of the metal protection block 402 on the silicon-based substrate 10 away from the display area 100 may coincide with an edge on one side of the orthographic projection of the opening K1 on the silicon-based substrate 10 close to the display area 100, that is, the interval between the two edges may be 0. However, this is not limited in the present embodiment.

The trace protection structure in an exemplary embodiment of the present disclosure is configured to protect the signal line integrated in the silicon-based substrate 10 during the preparation process of the display substrate, and there is no electrical connection between the trace protection structure and other electrodes.

Figure 11:
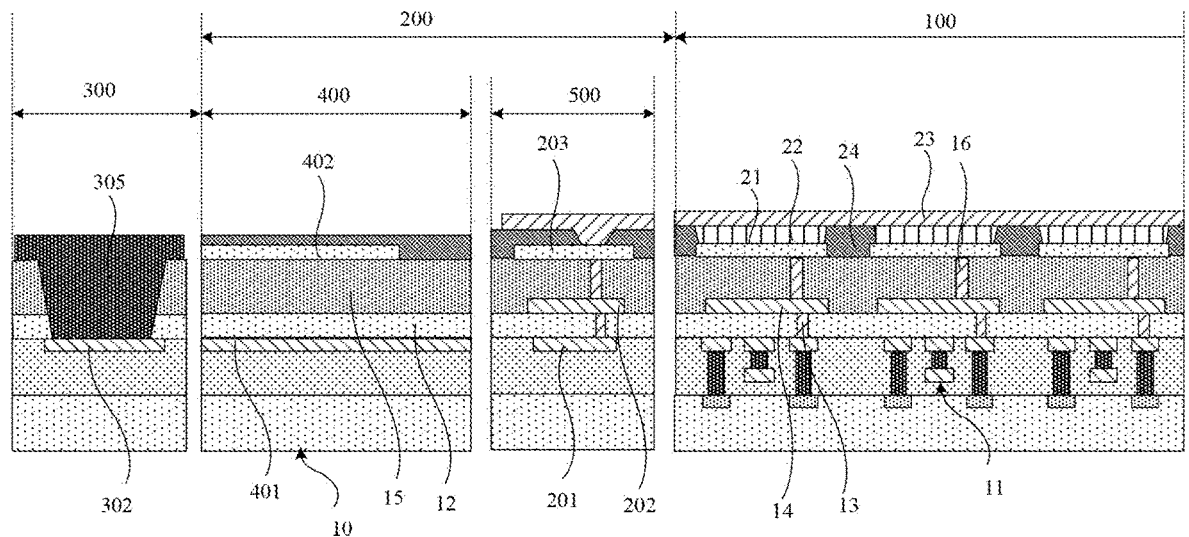
FIG. 11 is a schematic diagram of a structure after a cathode is formed according to at least one embodiment of the present disclosure.

(6) A pixel definition thin film is coated onto the silicon-based substrate 10 on which the above structure is formed, a pattern of a pixel definition layer (PDL) 24 is formed in the display area 100 and the peripheral area 200 by masking, exposure and development processes, and then a photoresist layer 305 is formed in the binding area 300, as shown in FIG. 11. In each display unit, the pixel definition layer 24 is provided with a pixel opening, and the pixel opening exposes the surface of the anode 21. The pixel definition layer 24 in the cathode ring area 500 is provided with a cathode via exposing the second connection electrode 203. In the trace area 400, the pixel definition layer 24 covers the metal protection blocks 402. For example, the height of the pixel definition layer 24 in the trace area 400 may be the same as the height of the photoresist layer 305 in the binding area 300.

By means of the photoresist layer 305, it is possible to prevent organics or metal from splashing onto the binding electrodes 302 in the subsequent evaporation process, and also prevent the encapsulation layer from directly contacting the binding electrode 302 during encapsulation.

(7) An organic light emitting layer 22 and a cathode 23 are sequentially formed on the silicon-based substrate 10 on which the aforementioned structure is formed, as shown in FIG. 11. The organic light emitting layer 22 is formed in each display unit in the display area 100, and is connected to the anode 21 of the display unit, in which the organic light emitting layer 22 is located, through the pixel opening. The boundary of the organic light emitting layer 22 may be located in a first dummy area between the cathode ring area 500 and the display area 100. The planar cathode 23 is formed in the display area 100 and the peripheral area 200, and the boundary of the cathode 23 may be located in the cathode ring area 500. The cathode 23 in the display area 100 is connected to the organic light emitting layer 22 of each display unit. In an exemplary embodiment, the cathode 23 may be a transflective electrode. After this patterning process, the film layer structures of the binding area 300 and the trace area 400 are not changed.

In the cathode ring area 500, the cathode 23 is connected with the second connection electrode 203 prepared on the same layer as the anode 21 through the cathode via arranged in the pixel definition layer 24. In this way, the first connection electrode 202 and the second connection electrode 203 form a conductive channel between the cathode 23 and the power supply electrode 201, and a voltage signal provided by the power supply electrode 201 is transmitted to the cathode 23 through the conductive channel, thus realizing a cathode ring structure. In order to ensure etching uniformity, the pattern design of the cathode ring in the cathode ring area 500 is consistent with the pattern design of the display area 100.

In an exemplary embodiment, the organic light emitting layer 22 may be a single-layer or multi-layer structure. For example, in some examples, the organic light emitting layer 22 may include a light emitting layer and a multi-layer structure consisting of one or more film layers including a hole injection layer, an electron injection layer, a hole transporting layer, an electron transporting layer, an electron blocking layer and a hole blocking layer. For example, the organic light emitting layer 22 may be made of an organic material, and emits light under the driving of the voltages of the anode 21 and the cathode 23 by utilizing the light emitting property of the organic material according to a required gray scale.

In an exemplary embodiment, the light emitting device is an OLED light emitting device, including an anode, an organic light emitting layer and a cathode. For example, the light emitting device emits white light. The light emitting device emitting white light may be implemented by a light emitting device that emits white light, for example, by an organic light emitting layer combination including a plurality of organic light emitting layers. The organic light emitting layer combination may include three organic light emitting layers emitting red, green and blue light, respectively. The three organic light emitting layers are stacked in this order relative to the silicon-based substrate, thereby emitting white light as a whole. Alternatively, the organic light emitting layer combination may include an organic light emitting layer emitting light of a color and an organic light emitting layer emitting light of a complementary color of the color. The two organic light emitting layers are stacked in this order relative to the silicon-based substrate, thereby emitting white light as a whole. The two organic light emitting layers include, for example, an organic light emitting layer emitting light of red color and an organic light emitting layer emitting light of a complementary color of the red color, which is not limited in the embodiments of the present disclosure as long as the emission of white light can be realized.

Figure 12:
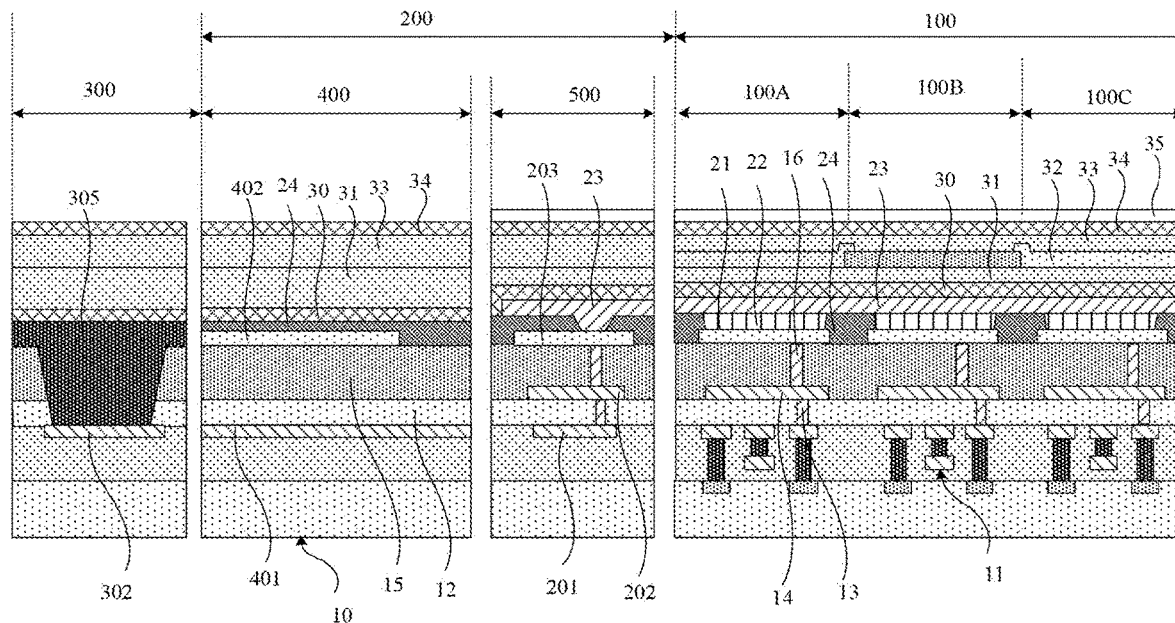
FIG. 12 is a schematic diagram of a structure after a cover panel is formed according to at least one embodiment of the present disclosure.

(8) Patterns of a first encapsulation layer 30 and a first flat layer 31 are formed on the silicon-based substrate 10 on which the above structure is formed. The first encapsulation layer 30 and the first flat layer 31 are formed in the display area 100, the peripheral area 200 and the binding area 300, as shown in FIG. 12.

In an exemplary embodiment, the first encapsulation layer 30 may include a plurality of film layers, such as a first sub-encapsulation layer of an inorganic material and a second sub-encapsulation layer of an organic material; or a first sub-encapsulation layer of an inorganic material, a second sub-encapsulation layer of an organic material and a third sub-encapsulation layer of an inorganic material, which are prepared by chemical vapor deposition (CVD), plasma enhanced chemical vapor deposition (PECVD), atomic layer deposition (ALD) or molecular layer deposition (MLD) equipment. The material of the first flat layer 31 includes, but is not limited to, polysiloxane-based materials, acrylic-based materials, polyimide-based materials, and the like.

After this patterning process, the binding area 300 includes a silicon-based substrate 10 provided with a binding electrode 302, a first insulating layer 12 and a second insulating layer 15 arranged on the silicon-based substrate 10 and exposing the binding electrodes 302, a photoresist layer 305 covering the binding electrodes 302, a first encapsulation layer 30 covering the photoresist layer 305, and a first flat layer 31 covering the first encapsulation layer 30.

(9) A pattern of a color filter layer 32 is formed on the silicon-based substrate 10 on which the above structure is formed. The color filter layer 32 is formed in the display area 100, and the color filter layer 32 in the display area 100 includes a first color unit, a second color unit and a third color unit corresponding to the display units, as shown in FIG. 12.

In an exemplary embodiment, units of different colors in the color filter layer 32 may overlap with each other as a black matrix, or a black matrix is arranged between units of different colors. In an exemplary embodiment, the first color unit may be a green unit, the second color unit may be a red unit, and the third color unit may be a blue unit. In some possible implementations, the preparation process of the color filter layer 32 includes: forming a blue unit first, then a red unit, and finally a green unit. In some possible implementations, the color filter layer 32 may include units of other colors, such as white units or yellow units. In this patterning process, the film layer structures of the binding area 300 and the peripheral area 200 are not changed.

(10) A second flat layer 33 and a second encapsulation layer 34 are formed on the silicon-based substrate 10 on which the aforementioned structure is formed, and then covered with a cover panel 35, as shown in FIG. 12. The second flat layer 33 and the second encapsulation layer 34 are formed in the display area 100, the peripheral area 200 and the binding area 300. The second flat layer 32 may planarize the display area 100, the peripheral area 200 and the binding area 300. The material of the second flat layer 32 includes, but is not limited to, polysiloxane-based materials, acrylic-based materials, polyimide-based materials, and the like.

In an exemplary embodiment, the second encapsulation layer 34 may include a plurality of film layers, such as a first sub-encapsulation layer of an inorganic material and a second sub-encapsulation layer of an organic material.

The cover panel 35 is formed by a sealing process, and the cover panel 35 is arranged in the cathode ring area 500 of the display area 100 and the peripheral area 200. For example, the cover panel 35 may be fixed by a sealant. The silicon-based substrate 10, the cover panel 35 and the sealant collectively form a closed space, which additionally provides protection against water and oxygen, and greatly prolongs the service life of the silicon-based OLED display substrate.

Figure 13:
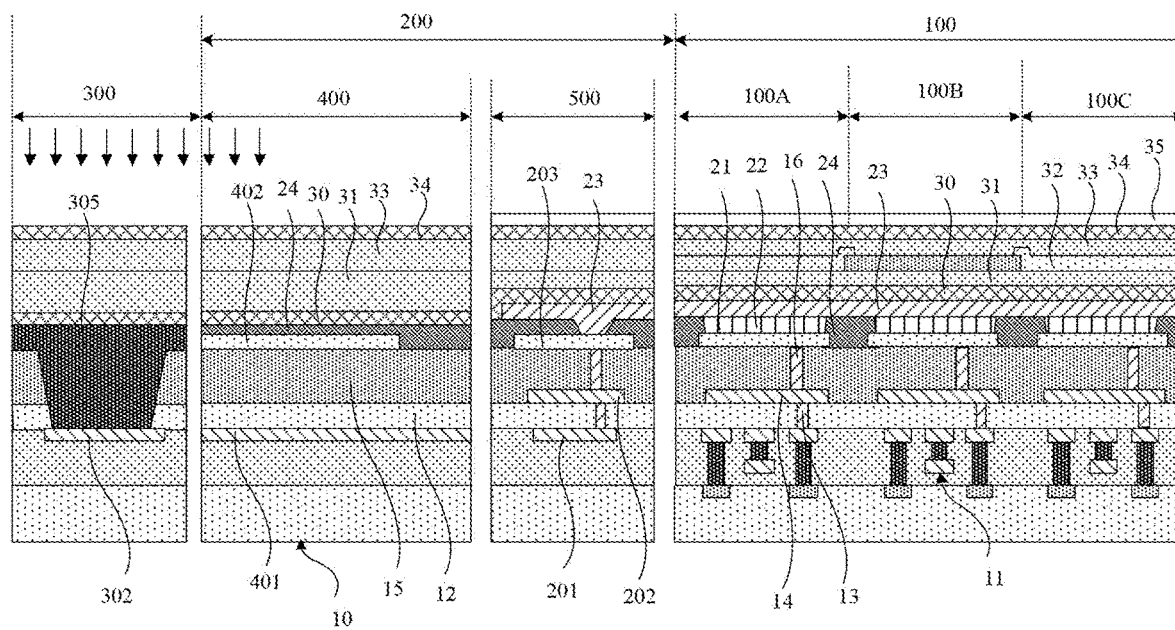
FIG. 13 is a schematic diagram of laser ablation according to at least one embodiment of the present disclosure.

(11) The binding area 300 is ablated by laser (as shown by the solid arrow in FIG. 13) to expose the binding electrode 302 to facilitate subsequent binding to a flexible printed circuit or wiring. When ablation by laser is performed downwardly, the metal protection blocks 402 in the trace area 400 can protect the signal lines 401 connecting the binding electrodes 302 and the control circuit in the silicon-based substrate 10, eliminate the risk of break due to laser ablation, and ensure normal input of electrical signals to the control circuit through the binding electrode 302, so as to provide display signals normally.

In the aforementioned preparation process, the first insulating thin film and the second insulating thin film may be made of any one or more of silicon oxide (SiOx), silicon nitride (SiNx), silicon oxynitride (SiON) and a compound semiconductor, which may be a single-layer structure or a multi-layer composite structure. The first metal thin film and the second metal thin film may be made of metal materials, including any one or more of argentum (Ag), copper (Cu), aluminum (Al) and molybdenum (Mo), or alloy materials composed of metals, such as aluminum neodymium alloy (AlNd) or molybdenum niobium alloy (MoNb), or may be a multi-layer composite structure, such as a Mo/Cu/Mo composite structure. Polyimide, acrylic, polyethylene terephthalate or the like may be used for the pixel definition layer.

As can be seen from the structure of the display substrate according to an exemplary embodiment of the present disclosure and the preparation process thereof, signal lines on the silicon-based substrate can be protected in the preparation process of the display substrate by arranging a trace protection structure in the trace area and arranging the trace protection structure on the same layer as the metal anode in the light emitting structure layer. Moreover, the preparation process according to an exemplary embodiment of the present disclosure can be realized by using mature preparation equipment, which has small improvements in process, has high compatibility, simple process flow, high production efficiency, low production cost and high yield, and therefore has a good application prospect.

The structure shown in an exemplary embodiment of the present disclosure and the preparation process thereof are merely an exemplary description. In an exemplary embodiment, corresponding structures may be changed and patterning processes may be added or reduced according to actual needs. The structure (or method) shown in the present embodiment may be appropriately combined with the structure (or method) shown in another embodiment.

Figure 14:
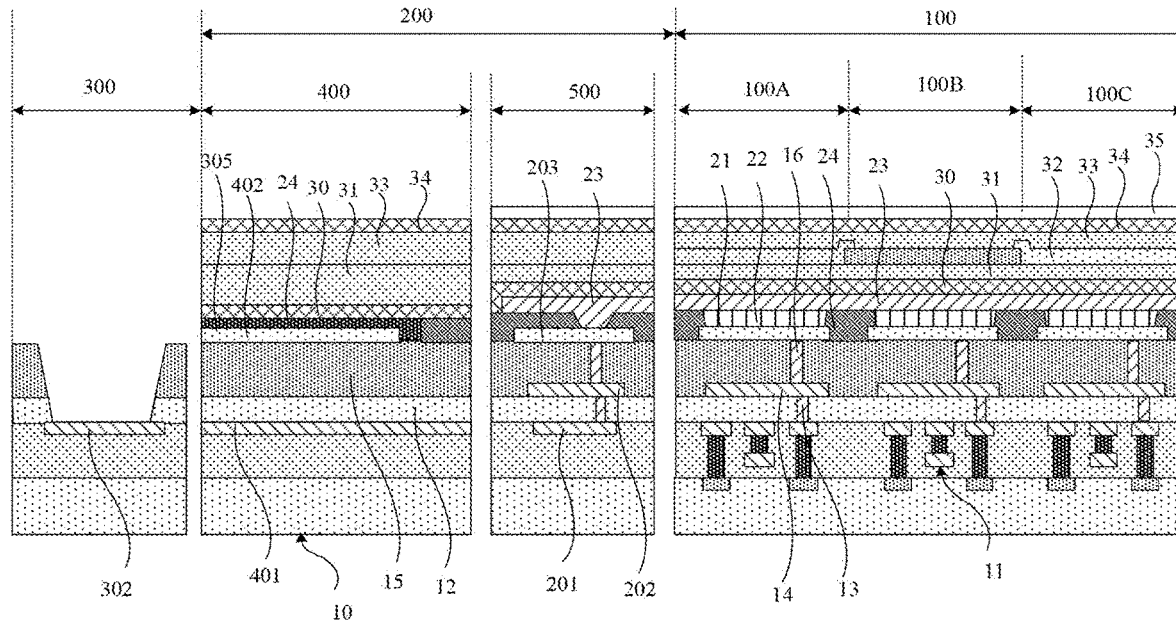
FIG. 14 is a schematic diagram of a display substrate according to at least one embodiment of the present disclosure.

FIG. 14 is a schematic diagram of a display substrate according to at least one embodiment of the present disclosure. As shown in FIG. 14, during the preparation process of the display substrate, the photoresist layer 305 covers the trace protection structure in the binding area 300 and the trace area 400, and after laser ablation of the photoresist layer 305, part of the photoresist layer 305 will remain on the trace protection structure. Other structures of the display substrate in this embodiment may be similar to those in the embodiment shown in FIG. 3, which hence will not be repeated here.

Figure 15:
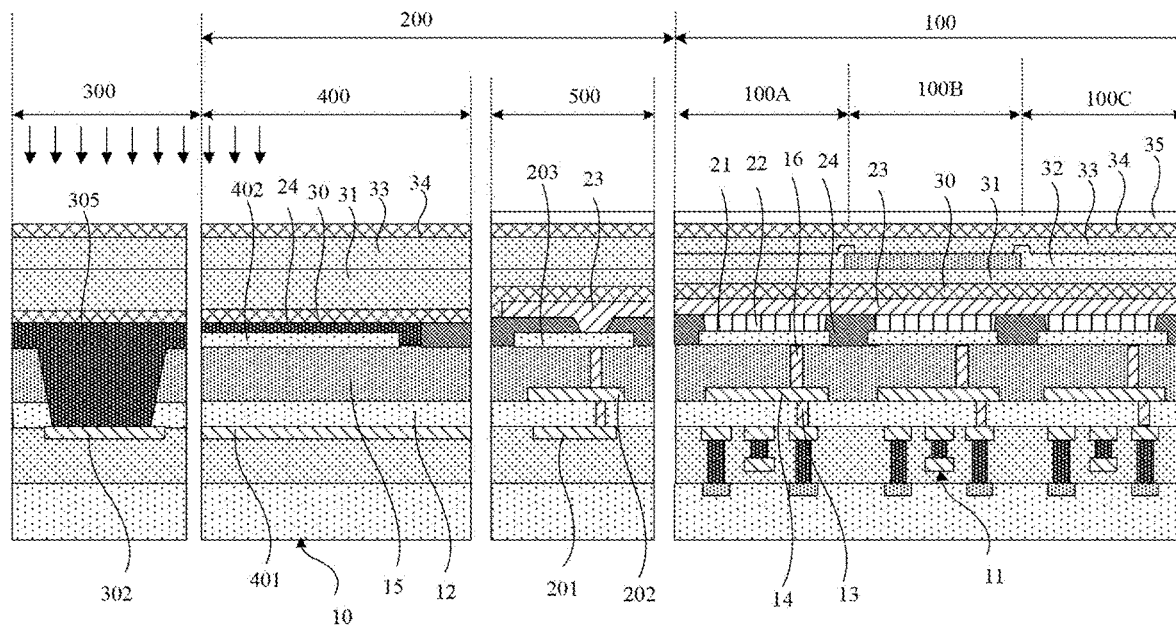
FIG. 15 is a schematic diagram of laser ablation according to at least one embodiment of the present disclosure.

In step (6) in the preparation process of the display substrate of this embodiment, a photoresist layer 305 is formed in the binding area 300 and the trace area 400. The photoresist layer 305 covers the metal protection blocks 402 in the binding area 300 and the trace area 400. FIG. 15 is a schematic diagram of laser ablation in step (11) of this embodiment. In this embodiment, after the covering with the cover panel 35, in the process of ablating the binding area 300 with laser, since the photoresist layer 305 covers the metal protection blocks 402, there will be a residue of the photoresist layer 305 on the metal protection blocks 402, as shown in FIG. 14.

The structure shown in an exemplary embodiment of the present disclosure and the preparation process thereof are merely an exemplary description. In an exemplary embodiment, corresponding structures may be changed and patterning processes may be added or reduced according to actual needs. The structure (or method) shown in the present embodiment may be appropriately combined with the structure (or method) shown in another embodiment.

Figure 16:
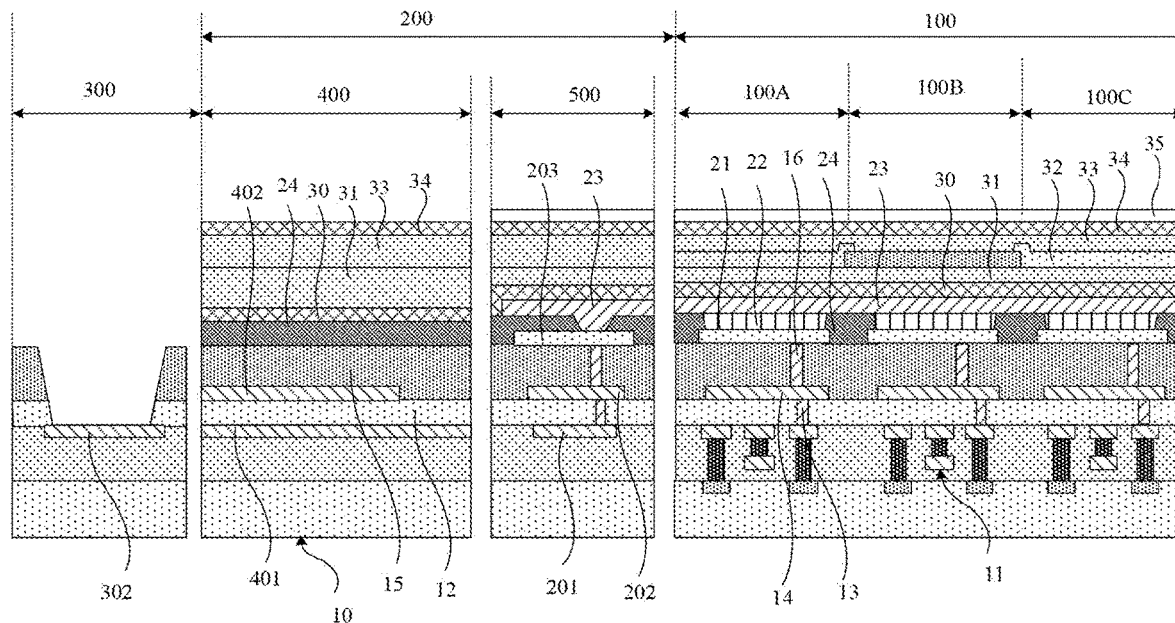
FIG. 16 is a schematic diagram of a display substrate according to at least one embodiment of the present disclosure.

FIG. 16 is a schematic diagram of a structure of a display substrate according to at least one embodiment of the present disclosure. As shown in FIG. 16, in this embodiment, the metal protection blocks 402 of the trace protection structure in the trace area 400 and the reflective electrodes 14 of the array structure layer are arranged on the same layer, and are formed by the same patterning process. Other structures of the display substrate in this embodiment may be similar to those in the embodiment shown in FIG. 3, which hence will not be repeated here.

In this embodiment, transparent conductive thin films such as indium tin oxide (ITO) or indium zinc oxide (IZO), or a composite structure of metal and transparent conductive thin films, such as ITO/Ag/ITO, may be used for the anode 21 of the light emitting structure layer. The anode 21 is connected with the reflective electrode 14 through the second conductive pillar 16, and the reflective electrode 14 is connected with the first pole of the driving transistor 11 through the first conductive pillar 13. In this way, an electrical signal provided by the pixel driving circuit is transmitted to the anode 21 through the reflective electrode 14. On the one hand, the reflective electrode 14 forms a conductive channel between the pixel driving circuit and the anode; and on the other hand, the reflective electrode 14 of each display unit can form a microcavity structure with the cathode 23, to cause, by utilizing the strong reflection effect of the reflective electrode 14, the light directly emitted by the organic light emitting layer 22 and the light reflected by the reflective electrode 14 to interfere with each other, thereby improving the color gamut of the emitted light and enhancing the brightness of the emitted light. This exemplary embodiment is not only beneficial to the control of light emitting devices by the pixel driving circuits, but also makes the structure of the display substrate more compact, which is beneficial to miniaturization of a silicon-based OLED display apparatus.

The structure shown in an exemplary embodiment of the present disclosure and the preparation process thereof are merely an exemplary description. In an exemplary embodiment, corresponding structures may be changed and patterning processes may be added or reduced according to actual needs. The structure (or method) shown in the present embodiment may be appropriately combined with the structure (or method) shown in another embodiment.

Figure 17:
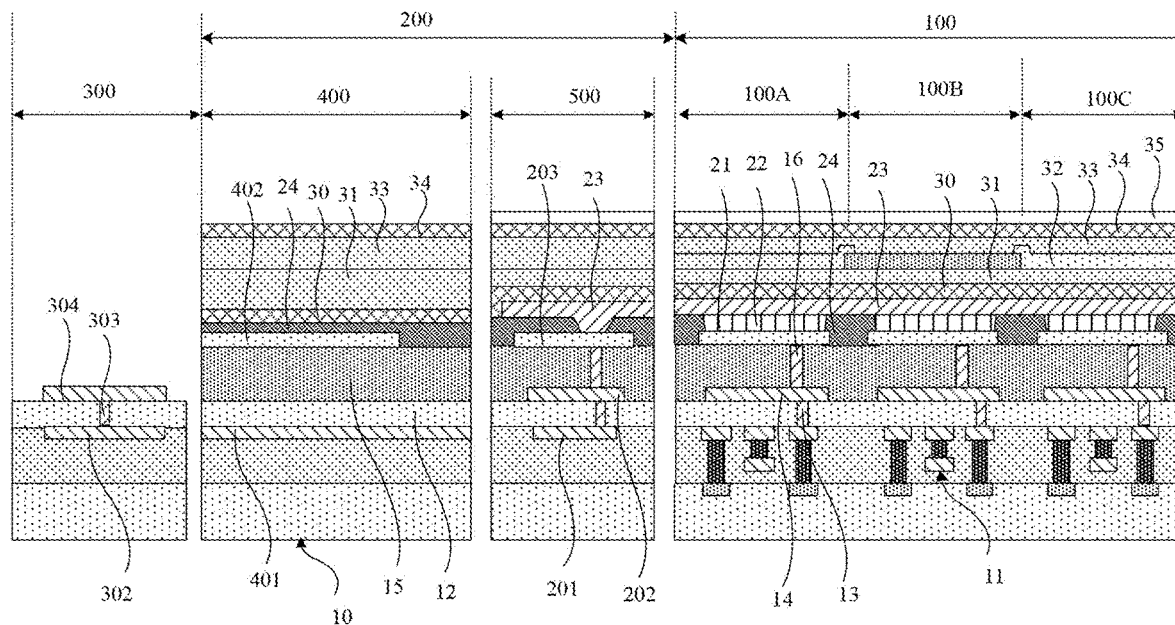
FIG. 17 is a schematic diagram of a display substrate according to at least one embodiment of the present disclosure.

FIG. 17 is a schematic diagram of a structure of a display substrate according to at least one embodiment of the present disclosure. As shown in FIG. 17, in this embodiment, in the binding area 300, the display substrate includes an array structure layer arranged on the silicon-based substrate 10 and an auxiliary pad assembly arranged on the array structure layer; and in the trace area 400, the trace protection structure and the anode of the light emitting structure layer are arranged on the same layer and formed by the same patterning process. Other structures of the display substrate in this embodiment may be similar to those in the embodiment shown in FIG. 3, which hence will not be repeated here.

As shown in FIG. 17, a binding electrode 302 is arranged in the silicon-based substrate 10 in the binding area 300, the array structure layer in the binding area 300 includes a first insulating layer 12 arranged on the silicon-based substrate 10, and the first insulating layer 12 is provided with a third via in which a third conductive pillar 303 connected with the binding electrode 302 is arranged. The auxiliary pad assembly is arranged on the first insulating layer 12 and is connected with the binding electrode 302 through the third conductive pillar 303. The auxiliary pad assembly includes a plurality of strip-shaped auxiliary binding electrodes 304 arranged at intervals. One auxiliary binding electrode 304 is connected with one strip-shaped binding electrode 302 in the pad assembly through one third conductive pillar 303.

As shown in FIG. 17, the trace protection structure includes a plurality of strip-shaped metal protection blocks 402 arranged at intervals, and the metal protection blocks 402 can correspond to the auxiliary binding electrodes 304 one by one. In some examples, the size of the auxiliary binding electrode 304 may be the same as that of the binding electrode 302, or the size of the auxiliary binding electrode 304 may be smaller than that of the binding electrode 302. In some examples, the surface of the auxiliary binding electrode 304 may be completely exposed, and the orthographic projection of the metal protection block 402 on the silicon-based substrate 10 does not overlap with the orthographic projection of the auxiliary binding electrode 304 on the silicon-based substrate 10. For example, the minimum distance between the edge of the orthographic projection of the metal protection block 402 on the silicon-based substrate 10 and the edge of the orthographic projection of the auxiliary binding electrode 304 on the silicon-based substrate 10 may be smaller than the maximum size of one subpixel. In some examples, the surface of the auxiliary binding electrode 304 may be partially exposed, the orthographic projection of the metal protection block 402 on the silicon-based substrate 10 does not overlap with the orthographic projection of the opening exposing the auxiliary binding electrode 304 on the silicon-based substrate 10, and the interval between the edge on one side of the orthographic projection of the metal protection block 402 on the silicon-based substrate 10 away from the display area 100 and the edge on one side of the orthographic projection of the opening of the corresponding auxiliary binding electrode 304 on the silicon-based substrate 10 close to the display area 100 may be smaller than the maximum size of one subpixel.

In this embodiment, the auxiliary binding electrode 304 and the reflective electrode 14 of the array structure layer in the display area 100 are arranged on the same layer and formed by the same patterning process. The metal protection block 402 and the anode 21 of metal material of the light emitting structure layer are arranged on the same layer and formed by the same patterning process.

The structure shown in an exemplary embodiment of the present disclosure and the preparation process thereof are merely an exemplary description. In an exemplary embodiment, corresponding structures may be changed and patterning processes may be added or reduced according to actual needs. The structure (or method) shown in the present embodiment may be appropriately combined with the structure (or method) shown in another embodiment.

Figure 18:
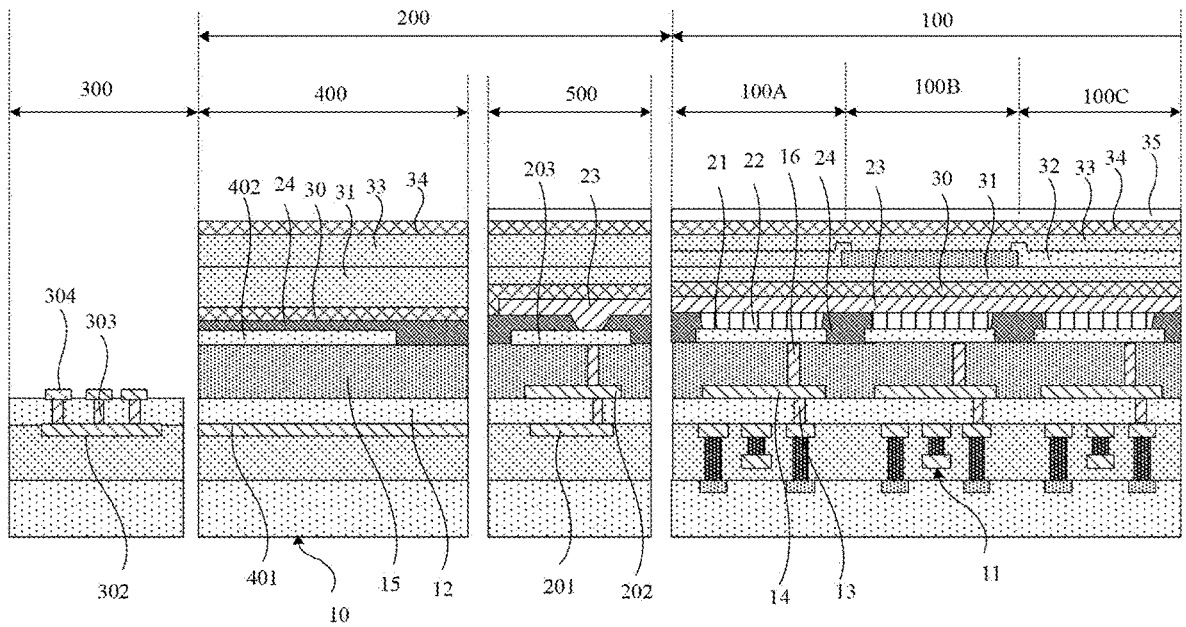
FIG. 18 is a schematic diagram of a display substrate according to at least one embodiment of the present disclosure.

FIG. 18 is a schematic diagram of a structure of a display substrate according to at least one embodiment of the present disclosure. As shown in FIG. 18, in the binding area 300, the display substrate includes an array structure layer arranged on the silicon-based substrate 10 and an auxiliary pad assembly arranged on the array structure layer; and in the trace area 400, the trace protection structure and the anode of the light emitting structure layer are arranged on the same layer and formed by the same patterning process. The auxiliary pad assembly includes a plurality of auxiliary binding electrodes 304 arranged in an array, and the plurality of auxiliary binding electrodes 304 are connected with one strip-shaped binding electrode 302 through a plurality of third conductive pillars 303. Other structures of the display substrate in this embodiment may be similar to those in the embodiment shown in FIG. 17, which hence will not be repeated here.

As shown in FIG. 18, a binding electrode 302 is arranged in the silicon-based substrate 10 in the binding area 300, and the array structure layer in the binding area 300 includes a first insulating layer 12 arranged on the silicon-based substrate 10. The first insulating layer 12 is provided with a third via in which a third conductive pillar 303 connected with the binding electrode 302 is arranged. The auxiliary pad assembly is arranged on the first insulating layer 12, and includes a plurality of auxiliary binding electrodes 304 arranged in an array. For example, three auxiliary binding electrodes 304 are respectively connected with one strip-shaped binding electrode 302 through three third conductive pillars 303.

In this embodiment, the auxiliary binding electrode 304 and the reflective electrode 14 of the array structure layer in the display area 100 are arranged on the same layer and formed by the same patterning process. The metal protection block 402 and the anode 21 of metal material of the light emitting structure layer are arranged on the same layer and formed by the same patterning process.

The structure shown in an exemplary embodiment of the present disclosure and the preparation process thereof are merely an exemplary description. In an exemplary embodiment, corresponding structures may be changed and patterning processes may be added or reduced according to actual needs. The structure (or method) shown in the present embodiment may be appropriately combined with the structure (or method) shown in another embodiment.

An embodiment of the present disclosure further provides a method for preparing a display substrate, including: forming an array structure layer and a light emitting structure layer sequentially on a silicon-based substrate in a display area, and forming a trace protection structure on a silicon-based substrate in a trace area between the display area and a binding area; wherein the binding area is located on one side of the display area, a pad assembly is integrated in the silicon-based substrate in the binding area, and a minimum distance between an edge of an orthographic projection of the trace protection structure on the silicon-based substrate and an edge of an orthographic projection of an opening of the pad assembly on the silicon-based substrate is smaller than a maximum size of one subpixel.

Figure 19:
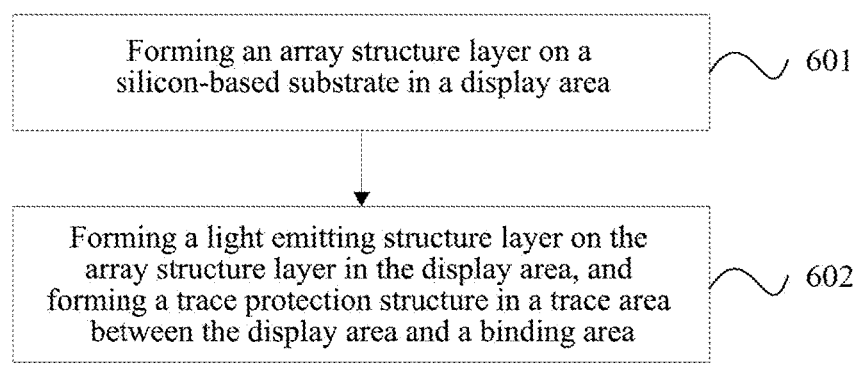
FIG. 19 is an exemplary flowchart of a method for preparing a display substrate according to at least one embodiment of the present disclosure.

FIG. 19 is a flowchart of a method for preparing a display substrate according to at least one embodiment of the present disclosure. As shown in FIG. 19, an embodiment of the present disclosure provides a method for preparing a display substrate, including the following steps.

Step 601: forming an array structure layer on a silicon-based substrate in a display area. Step 602: forming a light emitting structure layer on the array structure layer in the display area, and forming a trace protection structure in a trace area between the display area and a binding area.

The binding area is located on one side of the display area, a pad assembly is integrated in the silicon-based substrate in the binding area, and a minimum distance between an edge of an orthographic projection of the trace protection structure on the silicon-based substrate and an edge of an orthographic projection of an opening of the pad assembly on the silicon-based substrate is smaller than a maximum size of one subpixel.

In some exemplary embodiments, the pad assembly integrated in the silicon-based substrate in the binding area is configured to be bound to a flexible printed circuit. Forming the array structure layer on the silicon-based substrate in the display area and forming the trace protection structure on the silicon-based substrate in the trace area may include: forming a first insulating layer on the silicon-based substrate, wherein the first insulating layer in the display area is formed with a first via exposing the driving transistor of the silicon-based substrate; forming a first conductive pillar in the first via; forming a reflective electrode and a trace protection structure on the first insulating layer by a patterning process, wherein the reflective electrode is arranged in the display area and connected with the driving transistor through the first conductive pillar, and the trace protection structure is arranged in the trace area; forming a second insulating layer, wherein the second insulating layer in the display area is formed with a second via exposing the reflective electrode; and forming a second conductive pillar in the second via, wherein the second conductive pillar is connected with the reflective electrode.

In some exemplary embodiments, the pad assembly integrated in the silicon-based substrate in the binding area is configured to be bound to a flexible printed circuit. Forming the light emitting structure layer on the array structure layer in the display area and forming the trace protection structure on the silicon-based substrate in the trace area may include: forming an anode and a trace protection structure on the array structure layer by the same patterning process, wherein the anode is arranged in the display area and connected with the driving transistor of the silicon-based substrate through the array structure layer, and the trace protection structure is arranged in the trace area.

In some exemplary embodiments, the preparation method of this embodiment may further include: forming an array structure layer on the silicon-based substrate in the binding area, forming an auxiliary pad assembly on the array structure layer in the binding area, wherein the auxiliary pad assembly is configured to be bound to a flexible printed circuit. Forming the array structure layer on the silicon-based substrate in the display area and the binding area and forming the auxiliary pad assembly on the array structure layer in the binding area includes: forming a first insulating layer on the silicon-based substrate, wherein the first insulating layer in the display area is formed with a first via exposing the driving transistor of the silicon-based substrate, and the first insulating layer in the binding area is formed with a third via exposing the pad assembly of the silicon-based substrate; forming a first conductive pillar in the first via and forming a third conductive pillar in the third via; forming a reflective electrode and an auxiliary pad assembly on the first insulating layer, wherein the reflective electrode is arranged in the display area and connected with the driving transistor through the first conductive pillar, and the auxiliary pad assembly is arranged in the binding area and connected with the pad assembly through the third conductive pillar; forming a second insulating layer, wherein the second insulating layer in the display area is formed with a second via exposing the reflective electrode; and forming a second conductive pillar in the second via, wherein the second conductive pillar is connected with the reflective electrode.

In some exemplary embodiments, the auxiliary pad assembly is configured to be bound to a flexible printed circuit. Forming the light emitting structure layer on the array structure layer in the display area and forming the trace protection structure on the silicon-based substrate in the trace area includes: forming an anode and a trace protection structure on the second insulating layer by the same patterning process, wherein the anode is arranged in the display area and connected with the driving transistor of the silicon-based substrate through the reflective electrode, and the trace protection structure is arranged in the trace area.

In some exemplary embodiments, the preparation method of this embodiment may further include: forming a photoresist layer in the binding area, or in the binding area and on the trace protection structure, after forming the trace protection structure; and ablating the photoresist layer in the binding area by laser after encapsulation with a cover panel.

The preparation process of the display substrate has been described in detail in the previous embodiments and will not be repeated here.

An embodiment of the present disclosure further provides a display apparatus, including the display substrate described above. The display apparatus may be any product or component with a display function, such as a silicon-based OLED display, a mobile phone, a tablet computer, a television, a display, a notebook computer, a digital photo frame and a navigator, and the embodiments of the present disclosure are not limited thereto.

In the description of the embodiments of the present disclosure, the orientation or position relationship indicated by the terms "middle", "upper", "lower", "front", "rear", "vertical", "horizontal", "top", "bottom", "inner", "outer" and the like is based on the orientation or position relationship shown in the drawings, which is only for the convenience of describing the present disclosure and simplifying the description, rather than indicating or implying that the apparatus or element referred to must have the specific orientation, or be constructed and operated in the specific orientation, and thus cannot be interpreted as a limitation on the present disclosure.

Although the embodiments disclosed in the present disclosure are as described above, the described contents are only the embodiments for facilitating understanding of the present disclosure, which are not intended to limit the present disclosure. A person skilled in the art to which the present disclosure pertains may make any modifications and variations in the form and details of implementation without departing from the spirit and scope of the present disclosure. Nevertheless, the scope of patent protection of the present disclosure shall still be determined by the scope defined by the appended claims.

What we claim is:

1. A display substrate, comprising:
   a silicon-based substrate having a display area, a binding area located on one side of the display area, and a trace area located between the display area and the binding area;
   a trace protection structure being arranged on the silicon-based substrate in the trace area, and a pad assembly being integrated in the silicon-based substrate in the binding area; and a minimum distance between an edge of an orthographic projection of the trace protection structure on the silicon-based substrate and an edge of an orthographic projection of an opening of the pad assembly on the silicon-based substrate being smaller than a maximum size of one subpixel.

2. The display substrate according to claim 1, wherein
   the pad assembly comprises a plurality of strip-shaped binding electrodes arranged at intervals; and
   the trace protection structure comprises: a plurality of strip-shaped metal protection blocks arranged at intervals, the metal protection blocks correspond to the binding electrodes one by one, and a minimum distance between an edge of an orthographic projection of each metal protection block on the silicon-based substrate and an edge of an orthographic projection of an opening of the binding electrode on the silicon-based substrate is smaller than the maximum size of one subpixel.

3. The display substrate according to claim 2, wherein a length of the metal protection block ranges from 150 to 250 microns in a direction from the binding area to the display area.

4. The display substrate according to claim 2, an array structure layer being arranged on the silicon-based substrate in the display area, wherein
the array structure layer in the display area comprises: a first insulating layer arranged on the silicon-based substrate, a reflective electrode arranged on the first insulating layer, and a second insulating layer covering the reflective electrode,
the first insulating layer is provided with a first via exposing a driving transistor of the silicon-based substrate,
a first conductive pillar is arranged in the first via,
the reflective electrode is connected with the driving transistor through the first conductive pillar,
the second insulating layer is provided with a second via exposing the reflective electrode, and
a second conductive pillar connected with the reflective electrode is arranged in the second via.

5. The display substrate according to claim 3, an array structure layer being arranged on the silicon-based substrate in the display area, wherein
the array structure layer in the display area comprises: a first insulating layer arranged on the silicon-based substrate, a reflective electrode arranged on the first insulating layer, and a second insulating layer covering the reflective electrode,
the first insulating layer is provided with a first via exposing a driving transistor of the silicon-based substrate,
a first conductive pillar is arranged in the first via,
the reflective electrode is connected with the driving transistor through the first conductive pillar,
the second insulating layer is provided with a second via exposing the reflective electrode, and
a second conductive pillar connected with the reflective electrode is arranged in the second via.

6. A display apparatus, comprising the display substrate according to claim 2.

7. The display substrate according to claim 1, an array structure layer being arranged on the silicon-based substrate in the display area, wherein
the array structure layer in the display area comprises: a first insulating layer arranged on the silicon-based substrate, a reflective electrode arranged on the first insulating layer, and a second insulating layer covering the reflective electrode,
the first insulating layer is provided with a first via exposing a driving transistor of the silicon-based substrate,
a first conductive pillar is arranged in the first via,
the reflective electrode is connected with the driving transistor through the first conductive pillar,
the second insulating layer is provided with a second via exposing the reflective electrode, and
a second conductive pillar connected with the reflective electrode is arranged in the second via.

8. The display substrate according to claim 7, a light emitting structure layer being arranged on the array structure layer in the display area, wherein
the light emitting structure layer in the display area comprises: an anode arranged on the second insulating layer,
an organic light emitting layer connected with the anode and a cathode connected with the organic light emitting layer, and
the anode is connected with the reflective electrode by the second conductive pillar.

9. The display substrate according to claim 8, wherein
the pad assembly integrated in the silicon-based substrate in the binding area is configured to be bound to a flexible printed circuit; and
the trace protection structure is arranged on the same layer as the reflective electrode in the array structure layer in the display area, or the trace protection structure is arranged on the same layer as the anode in the light emitting structure layer in the display area.

10. The display substrate according to claim 8, an array structure layer being arranged on the silicon-based substrate in the binding area, and an auxiliary pad assembly for binding to a flexible printed circuit being arranged on the array structure layer in the binding area; wherein
the array structure layer in the binding area comprises a first insulating layer arranged on the silicon-based substrate, the first insulating layer is provided with a third via exposing the pad assembly of the silicon-based substrate, a third conductive pillar connected with the pad assembly is arranged in the third via, and the auxiliary pad assembly is arranged on the first insulating layer and is connected with the pad assembly through the third conductive pillar; and
the trace protection structure is arranged on the same layer as the anode in the light emitting structure layer in the display area.

11. The display substrate according to claim 10, wherein
the auxiliary pad assembly comprises a plurality of strip-shaped auxiliary binding electrodes arranged at intervals, and one auxiliary binding electrode is connected with one strip-shaped binding electrode in the pad assembly through the third conductive pillar; or
the auxiliary pad assembly comprises a plurality of auxiliary binding electrodes arranged in an array, and the plurality of auxiliary binding electrodes are respectively connected with one strip-shaped binding electrode through a plurality of third conductive pillars.

12. The display substrate according to claim 1, a photoresist layer being arranged on the trace protection structure.

13. A display apparatus, comprising the display substrate according to claim 1.

14. A method for preparing a display substrate, comprising:
forming an array structure layer and a light emitting structure layer sequentially on a silicon-based substrate in a display area, and forming a trace protection structure on a silicon-based substrate in a trace area between the display area and a binding area;
wherein the binding area is located on one side of the display area, a pad assembly is integrated in the silicon-based substrate in the binding area, and a minimum distance between an edge of an orthographic projection of the trace protection structure on the silicon-based substrate and an edge of an orthographic projection of an opening of the pad assembly on the silicon-based substrate is smaller than a maximum size of one subpixel.

15. The method according to claim 14, wherein the pad assembly integrated in the silicon-based substrate in the binding area is configured to be bound to a flexible printed circuit; and forming the array structure layer on the silicon-based substrate in the display area and forming the trace protection structure on the silicon-based substrate in the trace area comprises:
forming a first insulating layer on the silicon-based substrate, wherein the first insulating layer in the display area is formed with a first via exposing the driving transistor of the silicon-based substrate;

forming a first conductive pillar in the first via;

forming a reflective electrode and a trace protection structure on the first insulating layer by a patterning process, wherein the reflective electrode is arranged in the display area and connected with the driving transistor through the first conductive pillar, and the trace protection structure is arranged in the trace area;

forming a second insulating layer, wherein the second insulating layer in the display area is formed with a second via exposing the reflective electrode; and forming a second conductive pillar in the second via, wherein the second conductive pillar is connected with the reflective electrode.

16. The method according to claim 14, wherein the pad assembly integrated in the silicon-based substrate in the binding area is configured to be bound to a flexible printed circuit; and forming the light emitting structure layer on the array structure layer in the display area and forming the trace protection structure on the silicon-based substrate in the trace area comprises:

forming an anode and a trace protection structure on the array structure layer by the same patterning process, wherein the anode is arranged in the display area and connected with the driving transistor of the silicon-based substrate through the array structure layer, and the trace protection structure is arranged in the trace area.

17. The method according to claim 14, further comprising: forming an array structure layer on the silicon-based substrate in the binding area, and forming an auxiliary pad assembly on the array structure layer in the binding area, wherein the auxiliary pad assembly is configured to be bound to a flexible printed circuit;

wherein forming the array structure layer on the silicon-based substrate in the display area and the binding area and forming the auxiliary pad assembly on the array structure layer in the binding area comprises:

forming a first insulating layer on the silicon-based substrate, wherein the first insulating layer in the display area is formed with a first via exposing the driving transistor of the silicon-based substrate, and the first insulating layer in the binding area is formed with a third via exposing the pad assembly of the silicon-based substrate;

forming a first conductive pillar in the first via and forming a third conductive pillar in the third via;

forming a reflective electrode and an auxiliary pad assembly on the first insulating layer, wherein the reflective electrode is arranged in the display area and connected with the driving transistor through the first conductive pillar, and the auxiliary pad assembly is arranged in the binding area and connected with the pad assembly through the third conductive pillar;

forming a second insulating layer, wherein the second insulating layer in the display area is formed with a second via exposing the reflective electrode; and forming a second conductive pillar in the second via, wherein the second conductive pillar is connected with the reflective electrode.

18. The method according to claim 17, wherein forming the light emitting structure layer on the array structure layer in the display area and forming the trace protection structure on the silicon-based substrate in the trace area comprises:

forming an anode and a trace protection structure on the second insulating layer by the same patterning process, wherein the anode is arranged in the display area and connected with the driving transistor of the silicon-based substrate through the reflective electrode, and the trace protection structure is arranged in the trace area.

19. The method according to claim 14, further comprising: forming a photoresist layer in the binding area, or in the binding area and on the trace protection structure, after forming the trace protection structure; and ablating the photoresist layer in the binding area by laser after encapsulation with a cover panel.

* * * * *